United States Patent
Park et al.

(10) Patent No.: US 11,277,140 B1
(45) Date of Patent: Mar. 15, 2022

(54) SAMPLING PHASE-LOCKED LOOP

(71) Applicant: QUALCOMM Incorporated, San Diego, CA (US)

(72) Inventors: Dongmin Park, San Diego, CA (US); Alvin Siu-Chi Li, San Diego, CA (US); Masoud Moslehi Bajestan, San Diego, CA (US); Yiwu Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/340,914

(22) Filed: Jun. 7, 2021

(51) Int. Cl.
*H03L 7/091* (2006.01)
*H03L 7/081* (2006.01)
*H03L 7/099* (2006.01)
*H03L 7/197* (2006.01)

(52) U.S. Cl.
CPC .............. *H03L 7/091* (2013.01); *H03L 7/081* (2013.01); *H03L 7/099* (2013.01); *H03L 7/1974* (2013.01)

(58) Field of Classification Search
CPC ......... H03L 7/081; H03L 7/091; H03L 7/099; H03L 7/1974
See application file for complete search history.

(56) References Cited

U.S. PATENT DOCUMENTS

| | | | |
|---|---|---|---|
| 3,777,272 A * | 12/1973 | Fletcher | H03L 7/0992 327/156 |
| 6,593,783 B2 | 7/2003 | Ichimaru | |
| 7,212,051 B1 * | 5/2007 | Zhu | H03L 7/0893 327/12 |
| 7,932,757 B2 | 4/2011 | Raghunathan et al. | |
| 8,773,184 B1 * | 7/2014 | Petrov | H03L 7/093 327/157 |
| 9,246,500 B2 | 1/2016 | Perrott | |
| 2008/0072025 A1 * | 3/2008 | Staszewski | G06F 9/30032 712/241 |
| 2010/0171535 A1 * | 7/2010 | Shanan | H03L 7/1976 327/157 |
| 2015/0145567 A1 * | 5/2015 | Perrott | G04F 10/005 327/156 |
| 2016/0164460 A1 * | 6/2016 | Jang | H03B 5/1265 331/25 |
| 2016/0269172 A1 * | 9/2016 | Arcudia | H04L 7/0332 |
| 2017/0214408 A1 * | 7/2017 | Liang | H03M 1/1009 |
| 2018/0212611 A1 * | 7/2018 | Shen | H03L 7/0891 |
| 2019/0326915 A1 | 10/2019 | Moslehi Bajestan et al. | |
| 2020/0099506 A1 * | 3/2020 | Goudarzi | H04L 7/0004 |

(Continued)

OTHER PUBLICATIONS

Wu W., et al., "A 28-nm 75-fsrms Analog Fractional-N Sampling PLL With a Highly Linear DTC Incorporating Background DTC Gain Calibration and Reference Clock Duty Cycle Correction," IEEE Journal of Solid-State Circuits, May 2019, vol. 54, No. 5, pp. 1254-1265.

*Primary Examiner* — Adam D Houston
(74) *Attorney, Agent, or Firm* — Loza & Loza LLP

(57) ABSTRACT

In certain aspects, a sampler includes a sampling capacitor, a precharge switch coupled to the sampling capacitor, one or more discharge circuits coupled to the sampling capacitor, and a reference-voltage circuit coupled to the sampling capacitor. The reference-voltage circuit is configured to generate a reference voltage based on a supply voltage, and generate a voltage difference between a voltage on the sampling capacitor and the reference voltage.

38 Claims, 12 Drawing Sheets

(56) References Cited

U.S. PATENT DOCUMENTS

2020/0343898 A1   10/2020  Zuo et al.
2020/0366298 A1*  11/2020  Etou .................... H03L 7/0992
2021/0211134 A1*  7/2021  Tsutsumi ............... H03L 7/089

* cited by examiner

SAMPLING PHASE-LOCKED LOOP

BACKGROUND

Field

Aspects of the present disclosure relate generally to phase-locked loops (PLLs), and, more particularly, to sampling PLLs.

Background

A phase-locked loop (PLL) may be used to generate a signal having a desired frequency by multiplying the frequency of a reference signal by a corresponding amount. For example, a PLL may be used in a wireless device to generate a local oscillator signal having a desired frequency.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a sampler. The sampler includes a sampling capacitor, a precharge switch coupled to the sampling capacitor, one or more discharge circuits coupled to the sampling capacitor, and a reference-voltage circuit coupled to the sampling capacitor. The reference-voltage circuit is configured to generate a reference voltage based on a supply voltage, and generate a voltage difference between a voltage on the sampling capacitor and the reference voltage.

A second aspects relates to an apparatus. The apparatus includes a sampling capacitor, a precharge switch coupled to the sampling capacitor, one or more discharge circuits coupled to the sampling capacitor, and a reference-voltage circuit coupled to the sampling capacitor. The reference-voltage circuit includes a first capacitor, a second capacitor, a first switch coupled between the first capacitor and the second capacitor, a second switch coupled in parallel with the second capacitor, and a difference circuit coupled to the sampling capacitor and the first capacitor.

A third aspect relates to a method of sampling. The method includes charging a sampling capacitor to a supply voltage, discharging a portion of a charge on the sampling capacitor based on a phase error to generate a sampling voltage, generating a reference voltage based on the supply voltage, and generating a difference voltage between the sampling voltage and the reference voltage.

A fourth aspect relates to an apparatus for sampling. The apparatus includes means for charging a sampling capacitor to a supply voltage, means for discharging a portion of a charge on the sampling capacitor based on a phase error to generate a sampling voltage, means for generating a reference voltage based on the supply voltage, and means for generating a difference voltage between the sampling voltage and the reference voltage.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
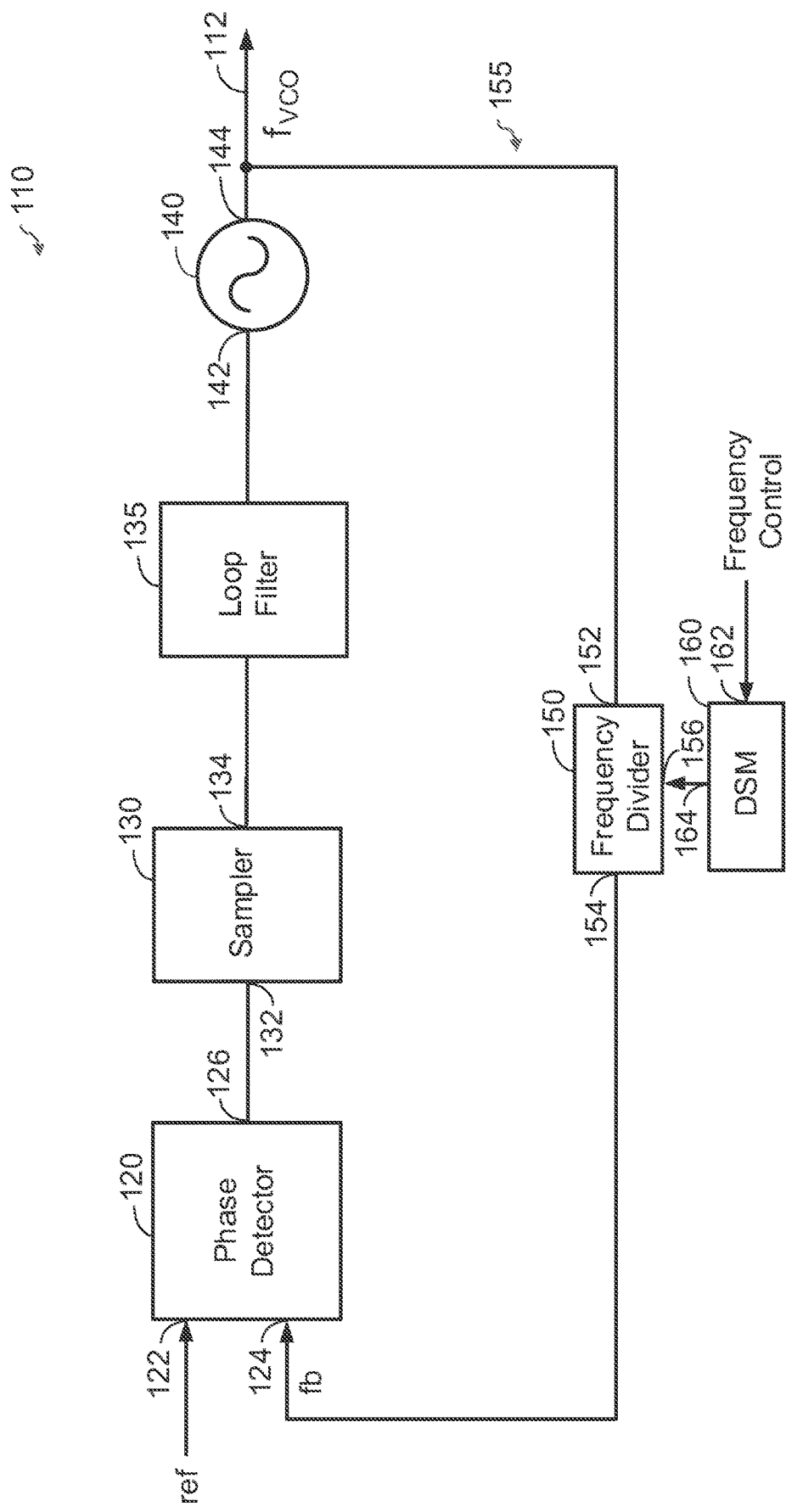
FIG. 1 shows an example of a phase-locked loop (PLL) according to certain aspects of the present disclosure.

FIG. 1 shows an example of a phase-locked loop (PLL) 110 according to certain aspects of the present disclosure. The PLL 110 may be used, for example, in a wireless device to generate a local oscillator signal (e.g., for frequency upconversion and/or frequency downconversion). In this example, the PLL 110 includes a phase detector 120, a sampler 130, a loop filter 135, a voltage controlled oscillator (VCO) 140, and a frequency divider 150. The phase detector 120 may also be referred to as a phase frequency detector (PFD), a phase comparator, or another term.

The phase detector 120 has a first input 122, a second input 124, and an output 126. The first input 122 is configured to receive a reference signal (labeled "ref"). The reference signal (e.g., reference clock signal) may come from a crystal oscillator (not shown) or another source. The sampler 130 has an input 132 coupled to the output 126 of the phase detector 120, and an output 134. The loop filter 135 is coupled between the output 134 of the sampler 130 and a control input 142 of the VCO 140. As discussed further below, the VCO 140 is configured to generate an output signal having a frequency (labeled "$f_{VCO}$") that is controlled by a voltage at the control input 142 of the VCO 140. The output signal is output at an output 144 of the VCO 140, which is coupled to the output 112 of the PLL 110. Thus, in this example, the output signal of the VCO 140 provides the output signal of the PLL 110.

The frequency divider 150 has an input 152 and an output 154. The input 152 of the frequency divider 150 is coupled to the output 144 of the VCO 140, and the output 154 of the frequency divider 150 is coupled to the second input 124 of the phase detector 120. Thus, in this example, the output signal of the VCO 140 is fed back to the second input 124 of the phase detector 120 through the frequency divider 150 via a feedback loop 155. In one example, the frequency divider 150 is configured to divide the frequency of the output signal of the VCO 140 by a divider N to generate a feedback signal (labeled "fb"). Thus, in this example, the feedback signal has a frequency approximately equal to $f_{VCO}/N$. The feedback signal is output at the output 154 of the frequency divider 150 and input to the second input 124 of the phase detector 120.

In operation, the phase detector 120 receives the reference signal at the first input 122 and receives the feedback signal at the second input 124. The phase detector 120 is configured to detect a phase error between the reference signal and the feedback signal, generate a phase-error signal indicating the detected phase error, and output the phase-error signal at the output 126. In some implementations, the phase-error signal includes a pulse having a width that is a function of the detected phase error. In one example, the detected phase error may be represented as a time error (i.e., time difference) between an edge (e.g., rising edge or falling edge) of the feedback signal and an edge (e.g., rising edge or falling edge) of the reference signal. In this example, the width of the pulse is equal to or proportional to the time error between the edge of the feedback signal and the edge of the reference signal.

The sampler 130 is configured to sample the phase-error signal from the phase detector 120, and output the sampled phase-error signal to the loop filter 135. The sampled phase-error signal may be a voltage or a current. The loop filter 135 filters the sampled phase-error signal into a voltage that is input to the control input 142 of the VCO 140 and controls the output frequency of the VCO 140.

The feedback loop 155 of the PLL 110 causes the phase detector 120, the sampler 130 and the loop filter 135 to adjust the voltage at the control input 142 of the VCO 140 in a direction that reduces the phase error between the feedback signal and the reference signal. When the PLL 110 is locked, the output frequency of the VCO 140 is approximately equal to the frequency of the reference signal multiplied by the divider N of the frequency divider 150. In other words, the output frequency is given by the following:

$$f_{VCO} = N \cdot f_{ref} \quad (1)$$

where $f_{ref}$ is the reference frequency (i.e., frequency of the reference signal). Thus, in this example, the output frequency of the VCO 140 is a multiple of the reference frequency and may be set to a desired frequency by setting the divider N of the frequency divider 150 accordingly based on equation (1).

In one example, the divider N of the frequency divider 150 is an integer greater than one. In this example, the output frequency of the VCO 140 is an integer multiple of the reference frequency.

In some implementations, the PLL 110 further includes a delta-sigma modulator (DSM) 160 to achieve a non-integer divider using the frequency divider 150. As used herein, the term "non-integer divider" may refer to a divider that includes a fractional part. In this example, the DSM 160 has an input 162 and an output 164. The output 164 of the DSM 160 is coupled to a control input 156 of the frequency divider 150. In this example, the frequency divider 150 is configured to set the divider N of the frequency divider 150 to any one of multiple integer values based on a divider control signal received from the DSM 160 via the control input 156.

In operation, the DSM 160 is configured to receive a frequency control signal (e.g., frequency control word) indicating a desired non-integer divider value. The DSM 160 then modulates the divider of the frequency divider 150 such that the average value of the divider is approximately equal to the desired non-integer divider value over multiple cycles of the reference signal. The DSM 160 may modulate the divider by changing the integer value of the divider over multiple cycles of the reference signal using the divider control signal such that the average value of the divider is approximately equal to the desired non-integer divider value. For example, the DSM 160 may achieve an average non-integer divider value of 6.25 over four cycles of the reference signal by setting the divider of the frequency divider 150 to six for three of the four cycles and to seven for one of the four cycles. The DSM 160 may be implemented with a first-order DSM, a second-order multi-state noise shaping (MASH) DSM, a third-order MASH DSM, or another type of DSM. In this example, the frequency divider 150 and the DSM 160 implement a "fractional-N divider."

Figure 2:
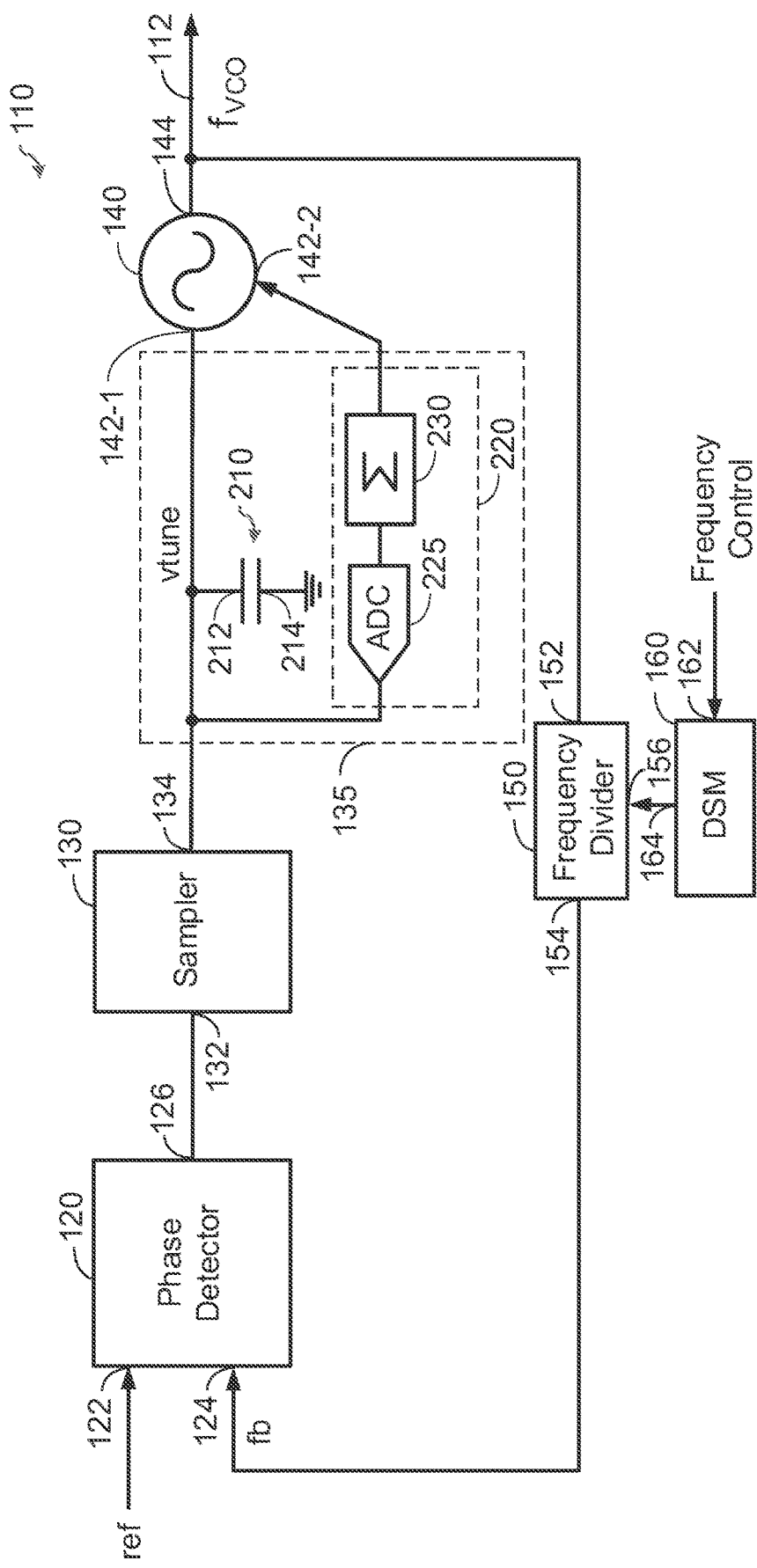
FIG. 2 shows an exemplary implementation of a loop filter according to certain aspects of the present disclosure.

FIG. 2 shows an exemplary implementation of the loop filter 135 according to certain aspects. In this example, the loop filter 135 includes a capacitor 210, and an integration path 220. In addition, the control input 142 of the VCO 140 includes a first control input 142-1 and a second control input 142-2.

In this example, a first terminal 212 of the capacitor 210 is coupled to a node between the output 134 of the sampler 130 and the first control input 142-1 of the VCO 140, and a second terminal 214 of the capacitor 210 is coupled to ground (or some reference voltage configured to function as a ground). The voltage (labeled "vtune") on the capacitor 210 is input to the first control input 142-1 of the VCO 140 to tune the output frequency of the VCO 140.

The integration path 220 is coupled between the output 134 of the sampler 130 and the second control input 142-2 of the VCO 140. The integration path 220 is configured to integrate the voltage vtune and further tune the output frequency of the VCO 140 based on the integration via the second control input 142-2. In the example in FIG. 2, the integration path 220 includes an analog-to-digital converter (ADC) 225 and an accumulator 230. The ADC 225 is configured to convert the voltage vtune into a digital signal, and the accumulator 230 is configured to integrate the digital signal. Thus, in this example, the integration path 220 performs integration in the digital domain.

However, it is to be appreciated that the loop filter 135 is not limited to the exemplary implementation shown in FIG. 2. For example, in other implementations, the loop filter 135 may include a low-pass filter (e.g., a resistor-capacitor (RC) filter) coupled to the output 134 of the sampler 130.

In one example, the VCO 140 may include an inductor-capacitor (LC) tank (not shown), in which the output frequency of the VCO 140 is tuned by tuning the capacitance of the LC tank. In this example, the LC tank may include one or more capacitors (e.g., varactors) having a capacitance tuned by the voltage vtune via the first control input 142-1, and one or more capacitors (e.g., capacitor banks) having a capacitance tuned by the output of the integration path 220 via the second control input 142-2. However, it is to be appreciated that the VCO 140 is not limited to this example, and that the VCO 140 may be implemented with other types of VCO circuits.

Figure 3:
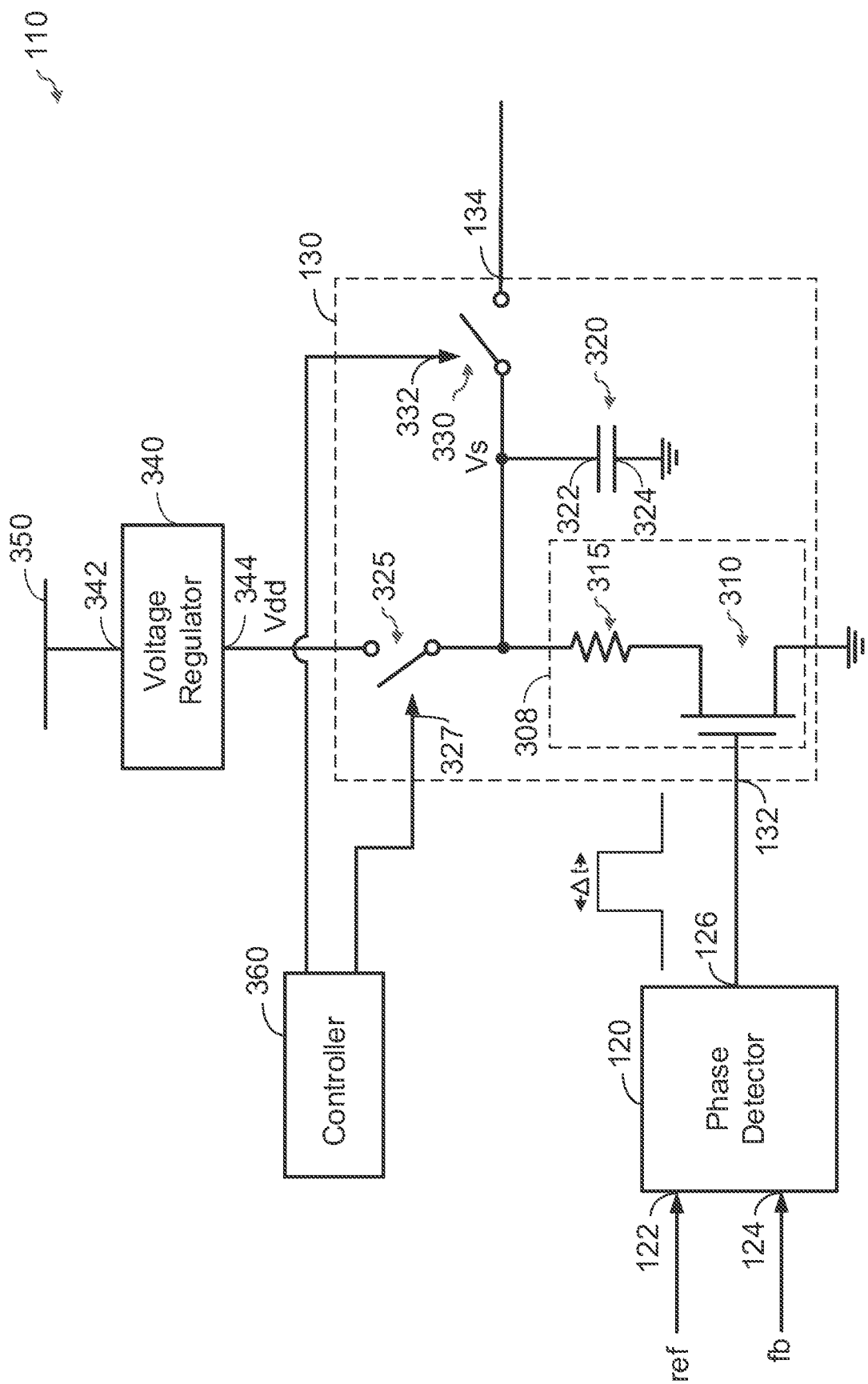
FIG. 3 shows an exemplary implementation of a sampler according to certain aspects of the present disclosure.

FIG. 3 shows an exemplary implementation of the sampler 130 according to certain aspects. In this example, the sampler 130 includes a discharge circuit 308, a sampling capacitor 320, a precharge switch 325, and a sampling switch 330.

As discussed further below, the discharge circuit 308 is configured to discharge the sampling capacitor 320 based on the phase-error signal from the phase detector 120 to generate a sampled voltage (labeled "Vs") indicative of the phase error between the reference signal and the feedback signal. In the example shown in FIG. 3, the discharge circuit 308 includes a transistor 310 and a resistor 315. The gate of the transistor 310 is coupled to the input 132 of the sampler 130, and the resistor 315 is coupled between the drain of the transistor 310 and a first terminal 322 of the sampling capacitor 320. In this example, the source of the transistor 310 is coupled to ground and a second terminal 324 of the sampling capacitor 320 is coupled to ground. However, it is to be appreciated that the sampler 130 is not limited to the example shown in FIG. 3. In other implementations, the resistor 315 may be coupled between the source of the transistor 310 and the first terminal 322 of the sampling capacitor 320, and the drain of the transistor 310 may be coupled to ground. Although one discharge circuit 308 is shown in FIG. 3, it is to be appreciated that the sampler 130 may include multiple discharge circuits coupled in parallel, in which each discharge circuit may include a respective resistor and a respective transistor.

The precharge switch 325 is coupled between an output 344 of a voltage regulator 340 and the first terminal 322 of the sampling capacitor 320, and the sampling switch 330 is coupled between the first terminal 322 of the sampling capacitor 320 and the output 134 of the sampler 130. In this example, the voltage regulator 340 has an input 342 coupled to a power supply rail 350. The voltage regulator 340 is configured to generate a regulated supply voltage Vdd at the output 344 of the voltage regulator 340 from a voltage on the power supply rail 350. Thus, in this example, the supply voltage Vdd is provided to the sampler 130. The voltage regulator 340 may be implemented with a low-dropout (LDO) regulator, a switching regulator, or another type of voltage regulator.

In this example, the precharge switch 325 and the sampling switch 330 are controlled by a controller 360. In this regard, the controller 360 is coupled to a control input 327 of the precharge switch 325 and is coupled to a control input 332 of the sampling switch 330. In this example, the controller 360 is configured to control the on/off state of the precharge switch 325 via the control input 327 and control the on/off state of the sampling switch 330 via the control input 332. The precharge switch 325 may be implemented with a transistor having a gate coupled to the control input 327, a transmission gate, or another type of switch. Similarly, the sampling switch 330 may be implemented with a transistor having a gate coupled to the control input 332, a transmission gate, or another type of switch.

To sample the phase-error signal, the sampling capacitor 320 is first precharged to the supply voltage Vdd during a precharge phase. To accomplish this, the controller 360 turns on the precharge switch 325, which allows the sampling capacitor 320 to be precharged to the supply voltage Vdd through the precharge switch 325. The controller 360 may also turn off the sampling switch 330 during the precharge phase. After the sampling capacitor 320 is precharged, the controller 360 turns off the precharge switch 325.

After the precharge phase, the gate of the transistor 310 is driven by the phase-error signal from the phase detector 120.

In one example, the phase-error signal includes a pulse having a width that is a function of the detected phase error between the reference signal and the feedback signal (e.g., the time error between the edge of the feedback signal and the edge of the reference signal). In this example, the phase-error signal turns on the transistor 310 for a time duration equal to the width of the pulse, which is a function of the detected phase error. Thus, the transistor 310 is turned on for a time duration that is a function of the detected phase error.

When the transistor 310 is turned on by the phase-error signal, the transistor 310 couples the resistor 315 to ground. This causes a portion of the charge on the sampling capacitor 320 to discharge to ground through the resistor 315. During this phase, the precharge switch 325 and the sampling switch 330 remain turned off. The sampled voltage as a function of time is given by:

$$Vs(t) = Vdd \cdot e^{-\frac{t}{RC}} \quad (2)$$

where Vs(t) is the sampled voltage as a function of time, t is time from the start of discharge, R is the resistance of the resistor 315, and C is the capacitance of the sampling capacitor 320.

The amount of charge that is discharged from the sampling capacitor 320 is a function of the time duration that the transistor 310 is turned on by the phase-error signal, which is a function of the detected phase error. As a result, the amount of charge that is discharged from the sampling capacitor 320 is a function of the detected phase error. Thus, the sampled voltage Vs on the sampling capacitor 320 at the end of the discharge is a function of the detected phase error, and therefore provides phase-error information. In one example, the sampled voltage Vs at the end of the discharge is given by:

$$Vs = Vdd \cdot e^{-\frac{\Delta t}{RC}} \quad (3)$$

where $\Delta t$ is the pulse width of the phase-error signal, and Vs in equation (3) is the sampled voltage at the end of the discharge. In this example, the pulse width $\Delta t$ may be approximately equal to the time error between the edge of the feedback signal and the edge of the reference signal. After the phase-error signal is sampled (i.e., after the transistor 310 turns off at the end of the pulse), the controller 360 turns on the sampling switch 330 to couple the sampling capacitor 320 to the output 134 of the sampler 130.

In certain aspects, in each cycle of the reference signal, the phase detector 120 detects the phase error between the reference signal and the feedback signal and outputs the corresponding phase-error signal to the sampler 130, and the sampler 130 samples the phase-error signal and outputs the corresponding sampled voltage Vs. Thus, in these aspects, the phase error is detected and sampled once per cycle of the reference signal.

As discussed above, the DSM 160 can be used to realize a non-integer divider value by modulating the divider of the frequency divider 150. However, modulating the divider of the frequency divider 150 introduces quantization error into the feedback signal. The quantization error causes fluctuations in the time error between the reference signal and the feedback signal, which degrades performance. The quantization error can be substantially canceled out by performing phase interpolation at the sampler 130, as discussed further below.

Figure 4:
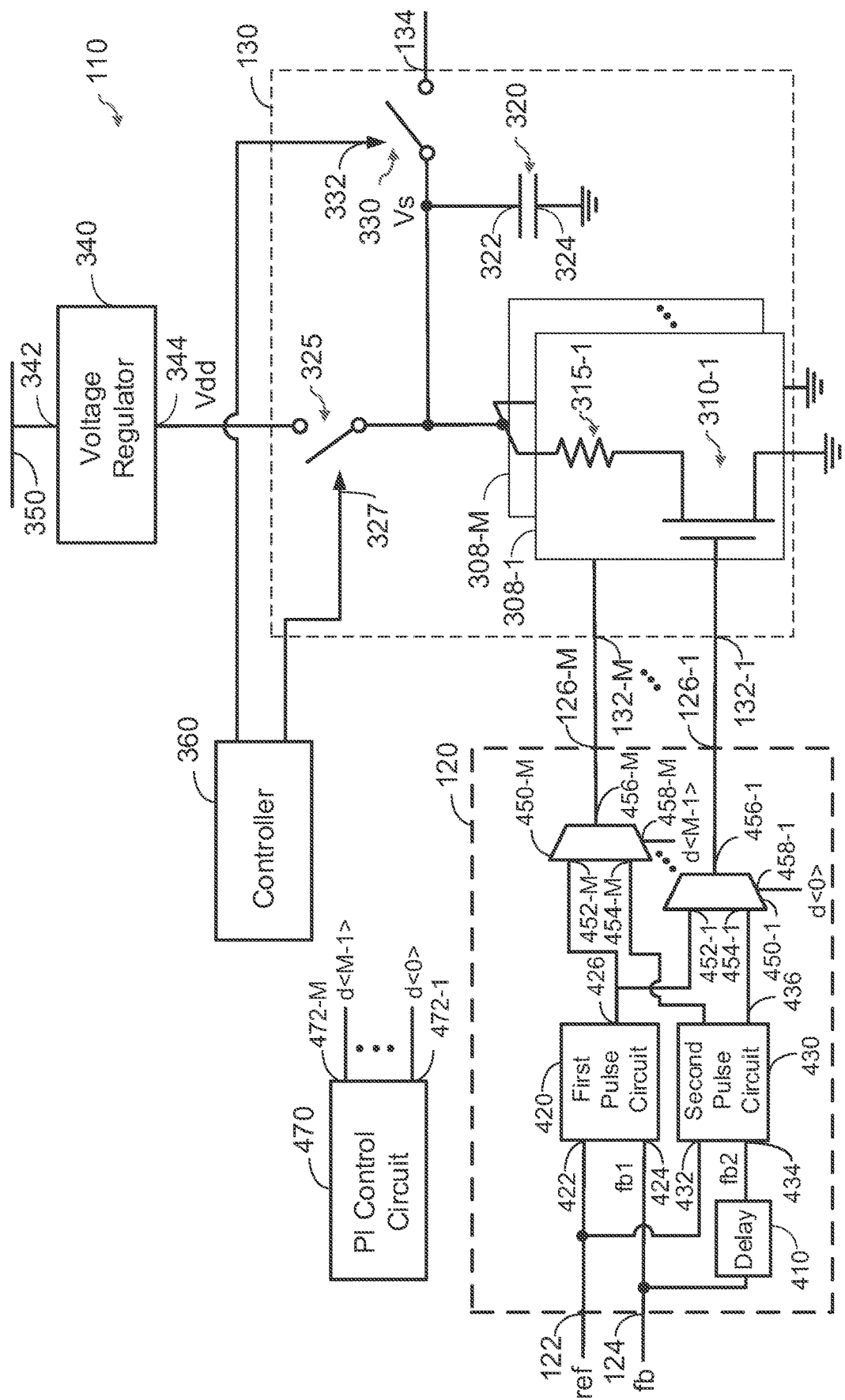
FIG. 4 shows an exemplary implementation of a sampler with phase interpolation according to certain aspects of the present disclosure.

FIG. 4 shows an exemplary implementation of the sampler 130 and the phase detector 120 employing phase interpolation according to certain aspects of the present disclosure. In this example, the sampler 130 includes multiple discharge circuits 308-1 to 308-M coupled in parallel between the first terminal 322 of the sampling capacitor 320 and ground. Each of the discharge circuits 308-1 to 308-M includes a respective transistor 310-1 to 310-M and a respective resistor 315-1 to 315-M coupled between the drain or the source of the respective transistor 310-1 to 310-M and the first terminal 322 of the sampling capacitor 320. In this example, the input 132 of the sampler 130 includes multiple inputs 132-1 to 132-M in which each of the inputs 132-1 to 132-M is coupled to a respective one of the discharge circuits 308-1 to 308-M, and, more particularly, to the gate of the transistor 310-1 to 310-M of the respective one of the discharge circuits 308-1 to 308-M.

In this example, the phase detector 120 includes a delay circuit 410, a first pulse circuit 420, a second pulse circuit 430, and multiple multiplexers 450-1 to 450-M. The first pulse circuit 420 has a first input 422, a second input 424, and an output 426. The first input 422 is coupled to the first input 122 of the phase detector 120, and the second input 424 is coupled to the second input 124 of the phase detector 120. Therefore, the first input 422 receives the reference signal and the second input 424 receives the feedback signal. In FIG. 4, the feedback signal is referred to internally in the phase detector 120 as "fb1".

The second pulse circuit 430 has a first input 432, a second input 434, and an output 436. The first input 432 is coupled to the first input 122 of the phase detector 120, and therefore receives the reference signal. The delay circuit 410 is coupled between the second input 124 of the phase detector 120 and the second input 434 of the second pulse circuit 430. The delay circuit 410 is configured to delay the feedback signal (e.g., by a delay equal to approximately one cycle (i.e., period) of the VCO 140), and output the resulting delayed feedback signal (labeled "fb2") to the second input 434 of the second pulse circuit 430. In one example, the delay circuit 410 may be implemented with a delay flip-flop that is clocked by the output signal of the VCO 140.

Each of the multiplexers 450-1 to 450-M has a first input 452-1 to 452-M, a second input 454-1 to 454-M, an output 456-1 to 456-M, and a select input 458-1 to 458-M. The first input 452-1 to 452-M of each of the multiplexers 450-1 to 450-M is coupled to the output 426 of the first pulse circuit 420, and the second input 454-1 to 454-M of each of the multiplexers 450-1 to 450-M is coupled to the output 436 of the second pulse circuit 430. In the example in FIG. 4, the output 126 of the phase detector 120 includes multiple outputs 126-1 to 126-M, in which each of the outputs 126-1 to 126-M is coupled to a respective one of the inputs 132-1 to 132-M of the sampler 130. In this example, the output 456-1 to 456-M of each of the multiplexers 450-1 to 450-M is coupled to a respective one of the outputs 126-1 to 126-M. As shown in FIG. 4, the output 456-1 to 456-M of each of the multiplexers 450-1 to 450-M is coupled to a respective one of the discharge circuits 308-1 to 308-M, and, more particularly, to the gate of the transistor 310-1 to 310-M of the respective one of the discharge circuits 308-1 to 308-M.

The select input 458-1 to 458-M of each of the multiplexers 450-1 to 450-M is configured to receive a respective bit of a digital code d<M-1:0>. Each of the multiplexers 450-1 to 450-M is configured to select the respective first input 452-1 to 452-M or the respective second input 454-1 to 454-M based on the bit value of the respective bit, and couple the selected input to the respective output 456-1 to 456-M. For example, a high bit value may trigger selection of the respective first input 452-1 to 452-M while a low bit value may trigger selection of the respective second input 454-1 to 454-M, or vice versa. As discussed further below, the digital code d<M-1:0> controls the phase interpolation at the sampler 130.

In operation, the first pulse circuit 420 is configured to detect a first time error between the reference signal and the feedback signal fb1, generate a first pulse having a width approximately equal to the first time error, and output the first pulse at the output 426. For example, the first pulse circuit 420 may be configured to generate the rising edge of the first pulse on an edge (e.g., rising edge or falling edge) of the feedback signal fb1 and generate the falling edge of the first pulse on an edge (e.g., rising edge or falling edge) of the reference signal.

The second pulse circuit 430 is configured to detect a second time error between the reference signal and the feedback signal fb2, generate a second pulse having a width approximately equal to the second time error, and output the second pulse at the output 436. For example, the second pulse circuit 430 may be configured to generate the rising edge of the second pulse on an edge (e.g., rising edge or falling edge) of the feedback signal fb2 and generate the falling edge of the second pulse on an edge (e.g., rising edge or falling edge) of the reference signal. Due to the presence of the delay circuit 410, the rising edge of the second pulse is shifted by the delay (e.g., approximately one cycle of the VCO 140) with respect to the rising edge of the first pulse. In combination with the multiplexers 450-1 to 450-M, the delay circuit 410 allows for phase interpolation to cancel out the effect of quantization error caused by modulation of the divider of the frequency divider 150, as discussed further below.

Thus, in this example, the first input 452-1 to 452-M of each of the multiplexers 450-1 to 450-M receives the first pulse from the first pulse circuit 420, and the second input 454-1 to 454-M of each of the multiplexers 450-1 to 450-M receives the second pulse from the second pulse circuit 430. Each of the multiplexers 450-1 to 450-M selects the first pulse or the second pulse based on the bit value of the respective bit of the digital code d<M-1:0>, and outputs the selected pulse to the gate of the respective transistor 310-1 to 310-M. Thus, in this example, the digital code d<M-1:0> controls the number of the transistors 310-1 to 310-M that are driven by the first pulse and the number of the transistors 310-1 to 310-M that are driven by the second pulse by controlling the pulse selections of the multiplexers 450-1 to 450-M.

In this example, the sampler 130 performs phase interpolation between the feedback signals fb1 and fb2, in which the digital code d<M-1:0> controls the phase interpolation by controlling the number of the transistors 310-1 to 310-M that are driven by the first pulse and the number of the transistors 310-1 to 310-M that are driven by the second pulse. The phase interpolation results in a sampled voltage Vs given by the following:

$$V_S = Vdd \cdot e^{-\frac{k \cdot T_{VCO} + M \cdot \Delta t}{RC}} \quad (4)$$

where k is the number of the transistors 310-1 to 310-M driven by the first pulse, M is the total number of the transistors 310-1 to 310-M, $T_{vco}$ is one cycle (i.e., period) of the VCO 140, and Δt is the time error between the feedback signal fb2 and the reference signal. Note that, in this example, the first pulse has a width approximately equal to $T_{vco}$+Δt and the second pulse has a width approximately equal to Δt since the rising edges of the feedback signals fb1 and fb2 are spaced apart by $T_{vco}$.

As shown in equation (4), the phase interpolation adjusts the sampled voltage Vs by adjusting the number k of the transistors 310-1 to 310-M driven by the first pulse using the digital code d<M−1:0>. In certain aspects, the sampled voltage Vs may be adjusted using phase interpolation to cancel out the effect of quantization error caused by modulation of the divider of the frequency divider 150.

In this regard, the PLL 110 may include a phase interpolation (PI) control circuit 470 configured to cancel the quantization error using phase interpolation according to certain aspects. In the example in FIG. 4, the PI control circuit 470 has multiple outputs 472-1 to 472-M where each of the outputs 472-1 to 472-M is coupled to the select input 458-1 to 458-M of a respective one of the multiplexers 450-1 to 450-M. For ease of illustration, the individual connections between the PI control circuit 470 and the multiplexers 450-1 to 450-M are not explicitly shown in FIG. 4.

In operation, the PI control circuit 470 determines the number k of the transistors 310-1 to 310-M that need to be driven by the first pulse to cancel the effect of the quantization error caused by the modulation of the divider by the DSM 160. For example, the DSM 160 may generate a DSM error signal indicating the quantization error due to the modulation of the divider, and input the DSM error signal to the PI control circuit 470. In this example, the PI control circuit 470 may determine the number k of the transistors 310-1 to 310-M that need to be driven by the first pulse to cancel the quantization error indicated by the DSM error signal. The PI control circuit 470 may then generate a digital code d<M−1:0> corresponding to the determined number k, and output the digital code d<M−1:0> to the multiplexers 450-1 to 450-M via the respective outputs 472-1 to 472-M. In response, the multiplexers 450-1 to 450-M drive k of the transistors 310-1 to 310-M with the first pulse and drive the remaining transistors 310-1 to 310-M (i.e., M-k of the transistors 310-1 to 310-M) with the second pulse.

To sample the phase-error signal in this example, the controller 360 turns on the precharge switch 325 to precharge the sampling capacitor 320 to the supply voltage Vdd through the precharge switch 325. After the sampling capacitor 320 is precharged, the controller 360 turns off the precharge switch 325, and the gates of the transistors 310-1 to 310-M are turned on, in which k of the transistors 310-1 to 310-M are driven by the first pulse and the remaining transistors 310-1 to 310-M (i.e., M-k of the transistors 310-1 to 310-M) are driven by the second pulse based on the digital code d<M−1:0>, as discussed above. This causes a portion of the charge on the sampling capacitor 320 to discharge to ground through the resistors 315-1 to 315-M, resulting in the sampled voltage Vs given in equation (4) above. After the phase-error signal is sampled, the controller 360 turns on the sampling switch 330 to couple the sampling capacitor 320 to the output 134 of the sampler 130. The above procedure may be performed in each cycle of the reference signal to detect the phase error and sample the detected phase error in each cycle of the reference signal.

A challenge with the sampler 130 is that the supply voltage Vdd provided by the voltage regulator 340 (e.g., LDO regulator) to precharge the sampling capacitor 320 fluctuates due to the finite bandwidth of the voltage regulator 340. The fluctuations (i.e., variations) in the supply voltage Vdd cause the sampled voltage Vs to vary cycle-to-cycle of the reference signal for a given phase error, which degrades the performance of the sampler 130 and leads to phase noise. Thus, there is a need to reduce the dependency of the sampled voltage Vs of the sampler 130 on cycle-to-cycle variation in the supply voltage Vdd from the voltage regulator 340.

Aspects of the present disclosure reduce the impact of supply voltage variation by generating a reference voltage based on the supply voltage. The reference voltage Vref is subtracted from the sampled voltage Vs to generate the control voltage vtune. Since the reference voltage Vref is generated based on the supply voltage, the reference voltage tracks changes in the sampled voltage Vs due to supply voltage variation. As a result, subtracting the reference voltage Vref from the sampled voltage Vs cancels the impact of the supply voltage variation, as discussed further below.

Figure 5:
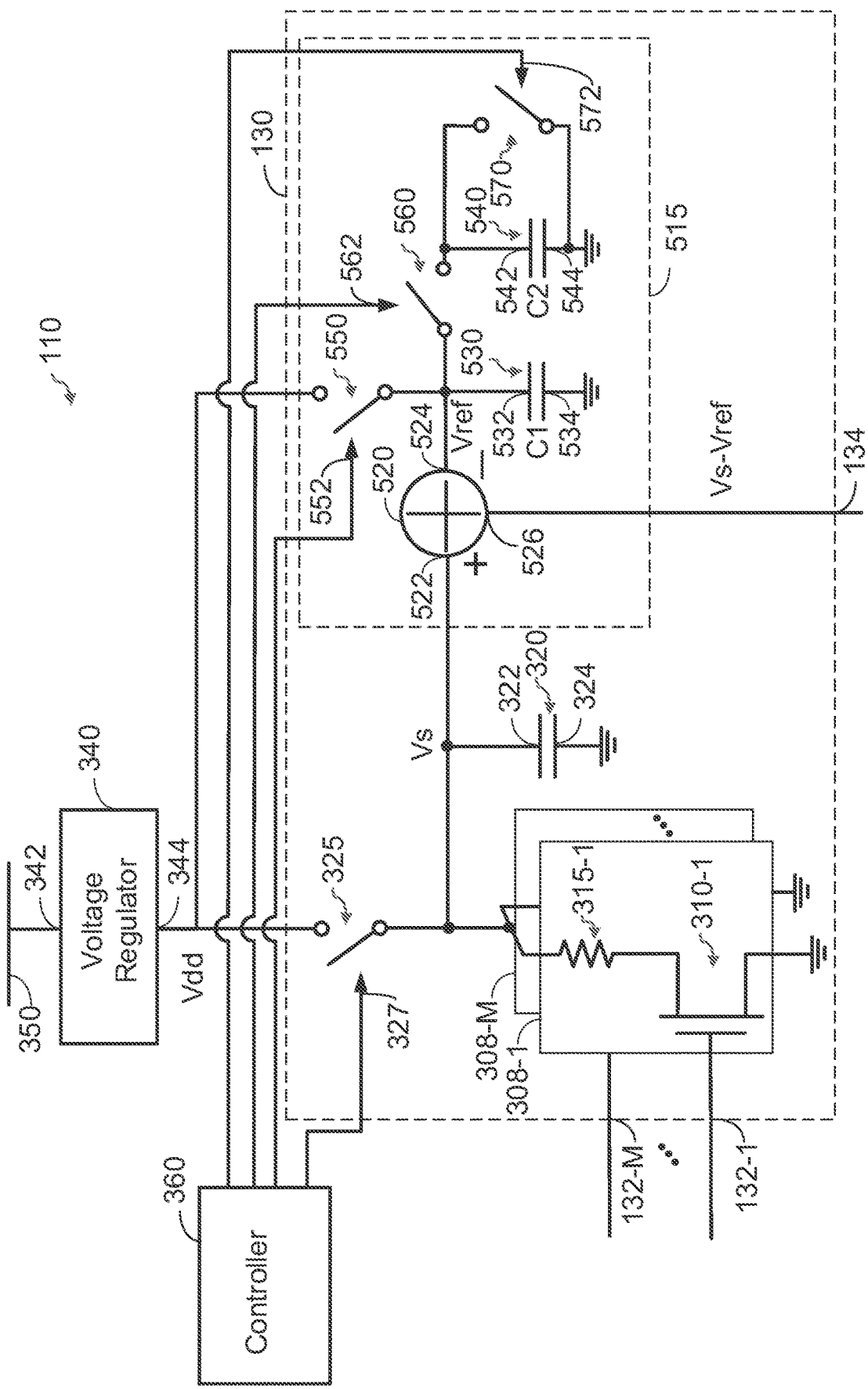
FIG. 5 shows an example of a reference-voltage circuit according to certain aspects of the present disclosure.

FIG. 5 shows an example in which the sampler 130 further includes a reference-voltage circuit 515 according to certain aspects of the present disclosure. The reference-voltage circuit 515 is configured to generate a reference voltage Vref based on the supply voltage and generate a voltage difference between the sampling voltage Vs and the reference voltage Vref, as discussed further below.

The reference-voltage circuit 515 includes a first capacitor 530, a second precharge switch 550, a second capacitor 540, a first switch 560, a second switch 570, and a difference circuit 520. The second precharge switch 550 is coupled between a first terminal 532 of the first capacitor 530 and the output 344 of the voltage regulator 340. A second terminal 534 of the first capacitor 530 is coupled to ground. The second capacitor 540 and the second switch 570 are coupled in parallel. The first switch 560 is coupled between the first terminal 532 of the first capacitor 530 and a first terminal 542 of the second capacitor 540. A second terminal 544 of the second capacitor 540 is coupled to ground.

In this example, the controller 360 controls the second precharge switch 550, the first switch 560, and the second switch 570. In this regard, the controller 360 is coupled to a control input 552 of the second precharge switch 550, a control input 562 of the first switch 560, and a control input 572 of the second switch 570. In this example, the controller 360 is configured to control the on/off state of the second precharge switch 550 via the control input 552, control the on/off state of the first switch 560 via the control input 562, and control the on/off state of the second switch 570 via the control input 572. The second precharge switch 550, the first switch 560, and the second switch 570 may each be implemented with a transistor, a transmission gate, or another type of switch. In the discussion below, the precharge switch 325 is referred to as the first precharge switch 325.

The difference circuit 520 has a first input 522 coupled to the sampling capacitor 320, a second input 524 coupled to the first capacitor 530, and an output 526 coupled to the output 134 of the sampler 130. As discussed further below, the difference circuit 520 is configured to generate a voltage difference between the sampled voltage Vs on the sampling capacitor 320 and the reference voltage Vref (e.g., subtract the reference voltage Vref from the sampled voltage Vs), and output the voltage difference at the output 526.

During the precharge phase, the controller 360 turns off the first switch 560 to isolate the first capacitor 530 from the second capacitor 540, and turns on the second switch 570 to discharge the second capacitor 540 to ground. The controller 360 also turns on the first precharge switch 325 to precharge the sampling capacitor 320 to the supply voltage Vdd, and turns on the second precharge switch 550 to precharge the first capacitor 530 to the supply voltage Vdd. Thus, during the precharge phase, the sampling capacitor 320 and the first capacitor 530 are both precharged to the supply voltage Vdd. In some implementations, the first precharge switch 325 and the second precharge switch 550 may be turned on and off synchronously.

During the sampling phase, the controller 360 turns off the first precharge switch 325. The discharge circuits 308-1 to 308-M discharge a portion of the charge on the sampling capacitor 320 based on the phase error detected by the phase detector 120 (not shown in FIG. 5) to produce the sampled voltage Vs (e.g., based on equation (4)). In some implementations, the discharge circuits 308-1 to 308-M perform phase interpolation (e.g., to cancel the quantization error), as discussed above with reference to FIG. 4. However, it is to be appreciated that, in other implementations, the discharge circuits 308-1 to 308-M may discharge the sampling capacitor 320 based on the detected phase error without phase interpolation (e.g., all the transistors 310-1 to 310-M may be driven by the same pulse). It is also to be appreciated that the sampler 130 may include any number of discharge circuits.

During a charge-sharing phase, the controller 360 turns off the second switch 570 and the second precharge switch 550, and turns on the first switch 560. Turning on the first switch 560 allows charge sharing between the first capacitor 530 and the second capacitor 540. The charge sharing generates the reference voltage Vref, which is given by the following:

$$Vref = Vdd \cdot \frac{C1}{C1 + C2} \quad (5)$$

where C1 is the capacitance of the first capacitor 530 and C2 is the capacitance of the second capacitor 540. As shown in equation (5), the reference voltage Vref is based on the supply voltage Vdd, and therefore tracks changes in the sampled voltage Vs due to variations in the supply voltage Vdd. This is because the first capacitor 530 is precharged with the same supply voltage Vdd as the sampling capacitor 320, and is therefore subject to the same variation in the supply voltage Vdd as the sampled voltage Vs. In some implementations, the charge-sharing phase may overlap the sampling phase. In other implementations, the charge-sharing phase may be after the sampling phase, as discussed further below.

The difference circuit 520 then subtracts the reference voltage Vref from the sampled voltage Vs and outputs the voltage difference (i.e., Vs−Vref) at the output 526. Since the reference voltage Vref tracks changes in the sampled voltage Vs due to supply voltage variation, the subtraction cancels the impact of the supply voltage variation when the condition Vs−Vref=0 is met. The condition Vs−Vref=0 can be maintained by the PLL loop itself when the PLL 110 is locked.

For the example where the PLL 110 includes the integration path 220, this condition can be maintained by the integration path 220 when the PLL 110 is locked. This is because the integration path 220 adjusts the output frequency of the VCO 140 to reduce the voltage vtune to approximately zero at low frequencies, which leads to the condition Vs−Vref=0. The condition Vs−Vref=0 locks the phase error between the reference signal and the feedback signal to a fixed phase error based on a ratio of the capacitance of the first capacitor 530 and the capacitance of the second capacitor 540 (i.e., C1 and C2). Because this phase error is fixed, this phase error has little to no impact on the ability of the PLL to maintain the VCO output frequency equal to the reference frequency times the desired frequency divider value.

The charge sharing between the first capacitor 530 and the second capacitor 540 allows the reference voltage Vref to be set to a desired ratio of the supply voltage Vdd by setting the capacitance of the first capacitor 530 and/or the capacitance of the second capacitor 540 accordingly based on equation (5). In one example, the reference voltage Vref may be set to a voltage that maximizes the gain of the sampler 130 when the condition Vs−Vref=0 is met. In this example, the gain of the sampler 130 may be maximum when the discharge time of the sampling capacitor 320 during the sampling phase and the RC time constant of the sampler 130 are approximately equal. Plugging the RC time constant for time t in equation (2) results in a voltage approximately equal to Vdd/e. Thus, in this example, the voltage of the reference voltage Vref may be set to approximately Vdd/e to maximize the gain by setting the capacitance of the first capacitor 530 and/or the capacitance of the second capacitor 540 accordingly based on equation (5).

Figure 6:
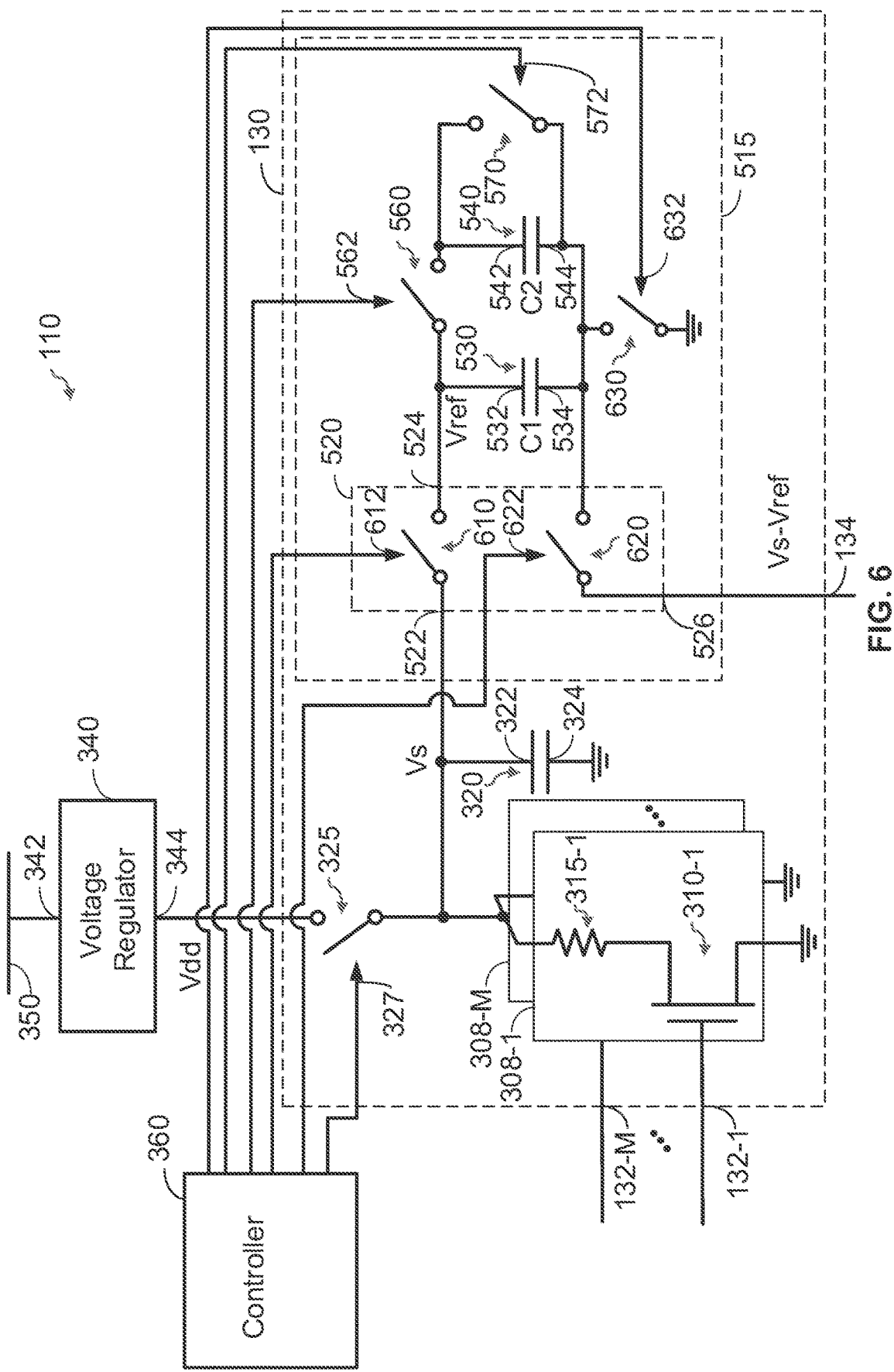
FIG. 6 shows another example of a reference-voltage circuit according to certain aspects of the present disclosure.

FIG. 6 shows an exemplary implementation of the difference circuit 520 according to certain aspects. In this example, the difference circuit 520 includes a third switch 610 coupled between the first terminal 322 of the sampling capacitor 320 and the first terminal 532 of the first capacitor 530, and a fourth switch 620 coupled between the second terminal 534 of the first capacitor 530 and the output 134 of the sampler 130. In this example, the sampler 130 may also include a fifth switch 630 coupled between the second terminal 534 of the first capacitor 530 and ground. The fifth switch 630 may also be coupled between the second terminal 544 of the second capacitor 540 and ground, as shown in the example in FIG. 6.

In this example, the controller 360 controls the third switch 610, the fourth switch 620, and the fifth switch 630. In this regard, the controller 360 is coupled to a control input 612 of the third switch 610, a control input 622 of the fourth switch 620, and a control input 632 of the fifth switch 630. In this example, the controller 360 is configured to control the on/off state of the third switch 610 via the control input 612, control the on/off state of the fourth switch 620 via control input 622, and control the on/off state of the fifth switch 630 via the control input 632. The third switch 610, the fourth switch 620, and the fifth switch 630 may each be implemented with a transistor, a transmission gate, or another type of switch.

In this example, the second precharge switch 550 is omitted. This is because the first capacitor 530 can be precharged through the third switch 610 of the difference circuit 520, as discussed further below. However, it is to be appreciated that the second precharge switch 550 may be included in other implementations to precharge the first capacitor 530.

During the precharge phase, the controller 360 turns on the precharge switch 325, the third switch 610, the fifth switch 630, and the second switch 570. The controller 360 turns off the fourth switch 620 and the first switch 560. During the precharge phase, the sampling capacitor 320 is precharged to the supply voltage Vdd through the precharge switch 325, the first capacitor 530 is precharged to the supply voltage Vdd through the precharge switch 325 and the third switch 610, and the second capacitor 540 is discharged to ground through the second switch 570 and the fifth switch 630. Thus, during the precharge phase, the sampling capacitor 320 and the first capacitor 530 are both precharged to the supply voltage Vdd. In some implementations, the precharge switch 325 and the third switch 610 may be turned on synchronously.

During the sampling phase, the controller 360 turns off the precharge switch 325 and turns off the third switch 610. The discharge circuits 308-1 to 308-M discharge a portion of the charge on the sampling capacitor 320 based on the phase error detected by the phase detector 120 (not shown in FIG. 6) to produce the sampled voltage Vs (e.g., based on equation (4)).

During the charge-sharing phase, the controller 360 turns off the second switch 570 and turns on the first switch 560. Turning on the first switch 560 allows charge sharing between the first capacitor 530 and the second capacitor 540, which generates the reference voltage Vref (e.g., based on equation (4)). During the charge-sharing phase, the controller 360 turns off the third switch 610 and the fourth switch 620, and turns on the fifth switch 630. In some implementations, the charge-sharing phase may overlap the sampling phase. In other implementations, the charge-sharing phase may start after the end of the sampling phase. For example, the sampling phase may produce noise on the ground rail. To prevent the noise on the ground rail from impacting the charge-sharing phase in this example, the charge-staring phase may start after the end of the sampling phase.

During a difference phase, the controller 360 turns on the third switch 610 and the fourth switch 620, and turns off the fifth switch 630. This couples the first capacitor 530 in series with the sampling capacitor 320, which subtracts the reference voltage Vref on the first capacitor 530 from the sampled voltage Vs on the sampling capacitor 320, resulting in the voltage difference Vs−Vref at the output 134 of the sampler 130. During the difference phase, the precharge switch 325 and the second switch 570 are turned off. In some implementations, the first switch 560 may be turned on during the difference phase since the reference voltage is also on the second capacitor 540 due to the charge sharing. In other implementations, the first switch 560 may be turned off during the difference phase.

The above switching sequence may be performed once per cycle of the reference signal to sample the phase error once per cycle of the reference signal. As discussed above, the voltage difference Vs−Vref improves performance of the PLL 110 by canceling the impact of the cycle-to-cycle supply voltage variation since the reference voltage Vref tracks supply voltage variation.

Figure 7:
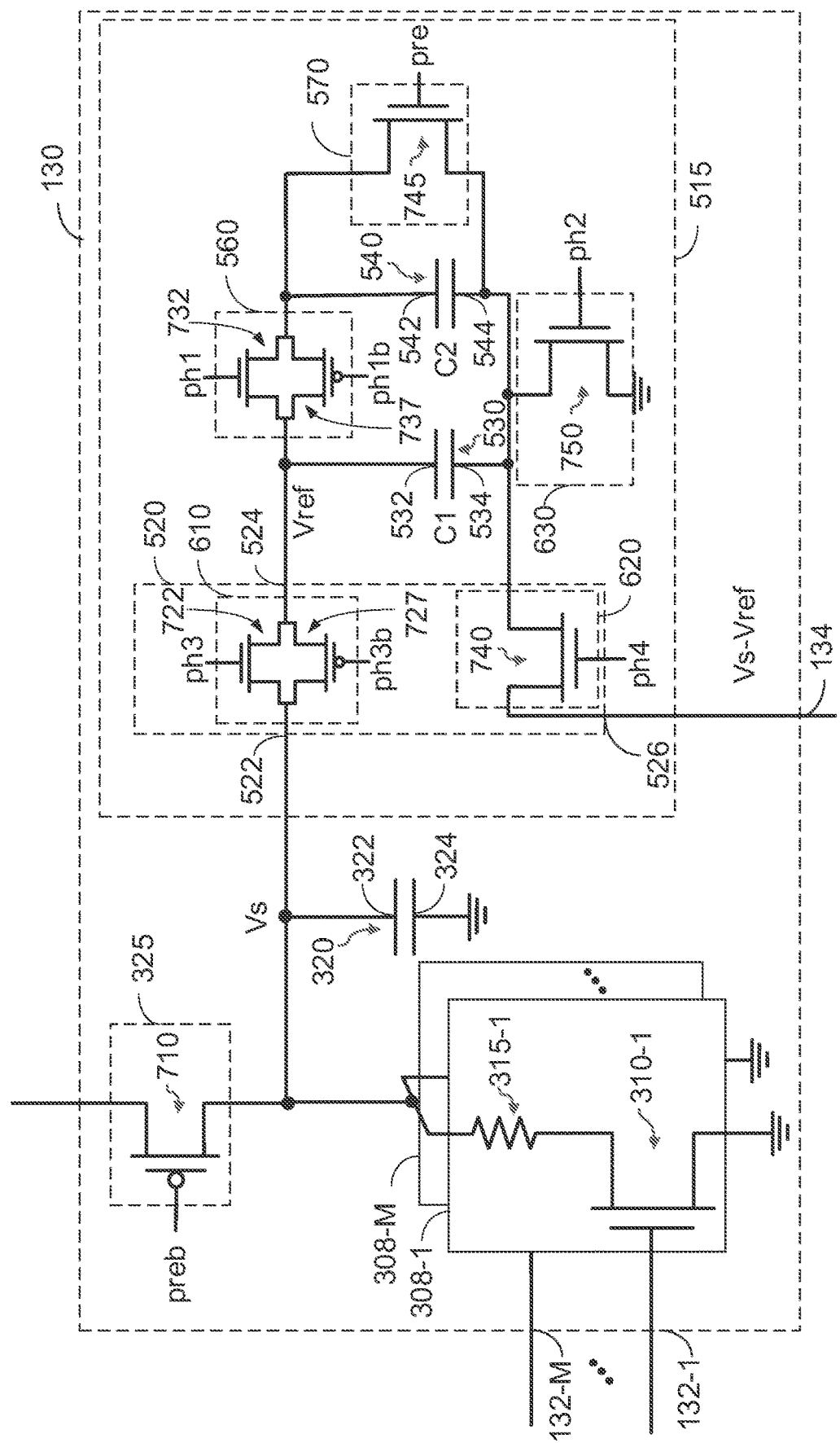
FIG. 7 shows an exemplary implementation of switches in a sampler according to certain aspects of the present disclosure.

FIG. 7 shows an exemplary implementation of the switches according to certain aspects of the present disclosure. In this example, the precharge switch 325 is implemented with a p-type field effect transistor (PFET) 710, the second switch 570 is implemented with an n-type field effect transistor (NFET) 745, the fourth switch 620 is implemented with an NFET 740, and the fifth switch 630 is implemented with an NFET 750. Also, in this example, the third switch 610 is implemented with a transmission gate including an NFET 722 and a PFET 727 coupled in parallel, and the first switch 560 is implemented with a transmission gate including an NFET 732 and a PFET 737 coupled in parallel.

The control input of each of the switches 325, 570, 620, and 630 is located at the gate of the respective transistor. In the example in FIG. 7, the control inputs of the switches 325, 570, 620, and 630 are driven by control signals preb, pre, ph4, and ph2, respectively, where preb and pre are complementary signals. The gate of the NFET 722 and the gate of the PFET 727 in the third switch 610 are driven by complementary control signals ph3 and ph3b, respectively. The gate of the NFET 732 and the gate of the PFET 737 in the first switch 560 are driven by complementary control signals ph1 and ph1b, respectively. The control signals are generated by the controller 360 (not shown in FIG. 7).

Figure 8:
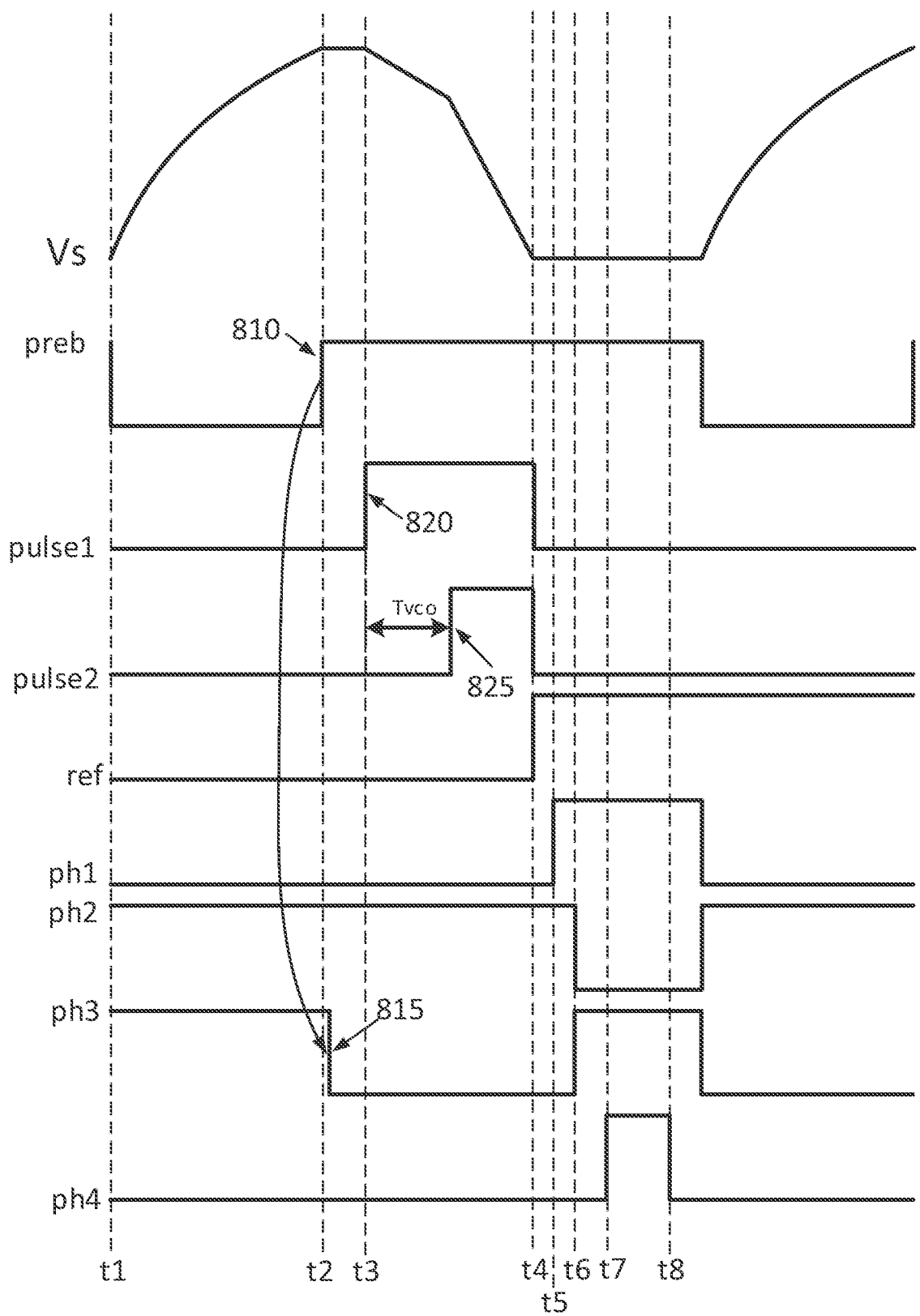
FIG. 8 is a timing diagram showing exemplary signals in the exemplary sampler shown in FIG. 7 according to certain aspects of the present disclosure.

FIG. 8 is a timing diagram showing examples of the signals in the sampler 130 according to certain aspects of the present disclosure. Between time t1 and t2 (e.g., precharge phase), the precharge switch 325 is turned on and the third switch 610 is turned on. As a result, the sampling capacitor 320 is precharged to the supply voltage Vdd through the precharge switch 325, causing the voltage Vs on the sampling capacitor 320 to rise to Vdd. In addition, the first capacitor 530 is precharged to the supply voltage Vdd through the precharge switch 325 and the third switch 610.

In this example, the rising edge 810 of the control signal preb triggers the falling edge 815 of control signal ph3. This is done so that the third switch 610 is left on for a short moment after the precharge switch 325 is turned off to help ensure that the voltage on the sampling capacitor 320 and the voltage on the first capacitor 530 are approximately the same after precharging.

Also, between time t1 and t2, the second switch 570 is turned on. This is because the second switch 570 is implemented with the NFET 745 in this example and is driven by control signal pre (not shown in FIG. 8), which is the complement of control signal preb. As a result, the second capacitor 540 is discharged to ground.

Between time t3 and t4 (e.g., sampling phase), the discharge circuits 308-1 to 308-M discharge a portion of the charge on the sampling capacitor 320 based on the phase error detected by the phase detector 120 to produce the sampled voltage Vs indicating the sampled phase error. In this example, k of the discharge circuits 308-1 to 308-M are driven by the first pulse (labeled "pulse1") and the remaining discharge circuits 308-1 to 308-M (i.e., M-k of the discharge circuits 308-1 to 308-M) are driven by the second pulse (labeled "pulse2") to perform phase interpolation, as discussed above with reference to FIG. 4. In this example, the rising edge 820 of the first pulse and the rising edge 825 of the second pulse are spaced apart by one cycle Tvco of the VCO 140.

At time t5, the first switch 560 is turned on, which allows charge sharing between the first capacitor 530 and the second capacitor 540 to generate the reference voltage Vref (e.g., based on equation (5)). In one example, the turning on of the first switch 560 may be triggered by the rising edge of the reference signal.

At time t6, the fifth switch 630 is turned off. This decouples the second terminal 534 of the first capacitor 530 and the second terminal 544 of the second capacitor 540 from ground, making the first capacitor 530 and the second capacitor 540 floating. Also, the third switch 610 is turned on to generate the voltage difference Vs−Vref.

At time t7, the fourth switch 620 is turned on, which couples the voltage difference Vs-Vref to the output 134 of the sampler 130. As a result, the voltage difference Vs−Vref is transferred to the output 134 of the sampler 130. At time t8, the fourth switch 620 is turned off to sample the phase error for the next cycle of the reference signal.

Figure 9:
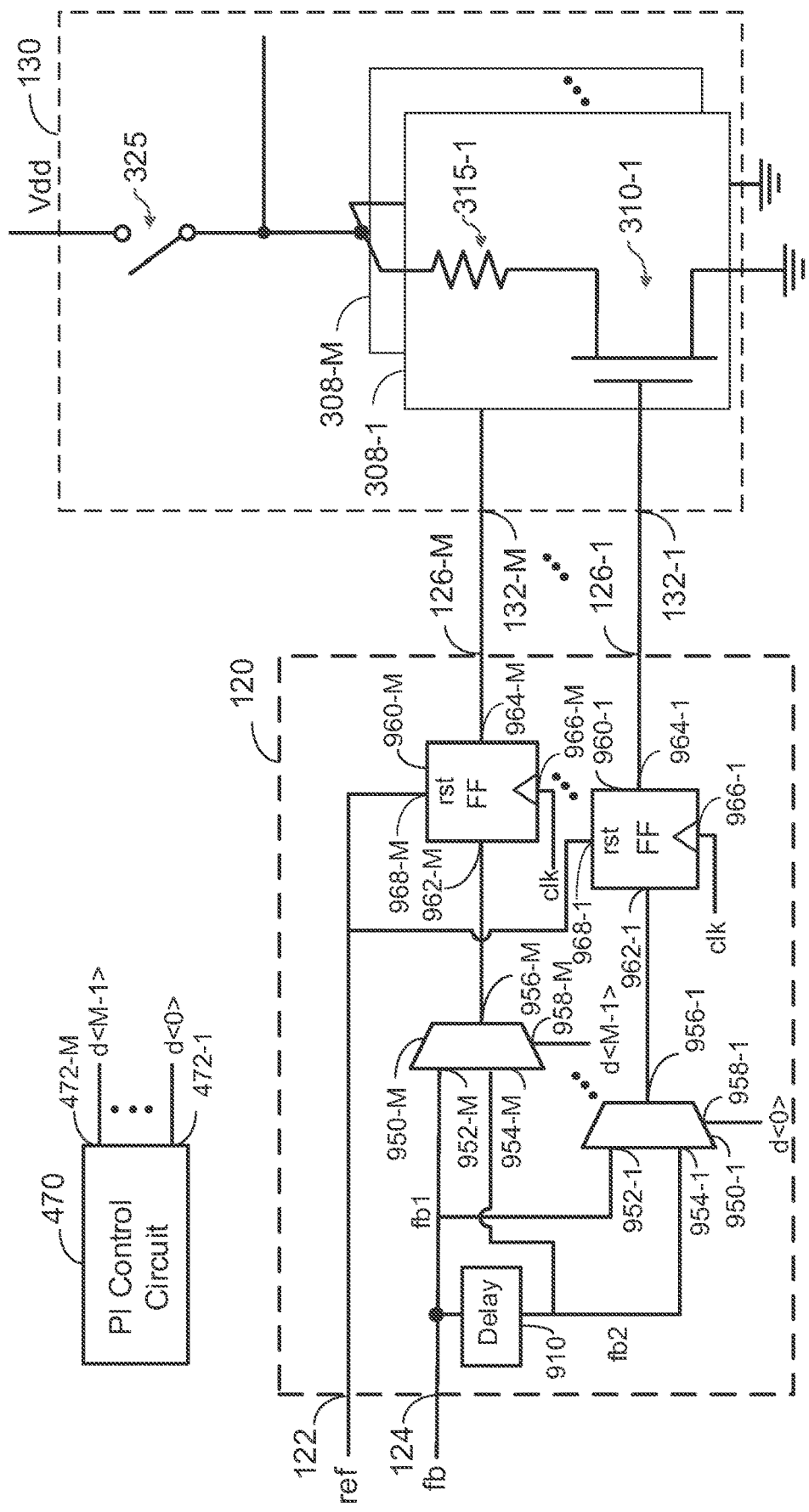
FIG. 9 shows an exemplary implementation of a phase detector according to certain aspects of the present disclosure.

FIG. 9 shows another exemplary implementation of the phase detector 120 that supports phase interpolation according to certain aspects. In this example, the phase detector 120 includes a delay circuit 910, multiple multiplexers 950-1 to 950-M, and multiple flip-flops (FFs) 960-1 to 960-M.

Each of the multiplexers 950-1 to 950-M has a first input 952-1 to 952-M, a second input 954-1 to 954-M, an output 956-1 to 956-M, and a select input 958-1 to 958-M. The first input 952-1 to 952-M of each of the multiplexers 950-1 to 950-M is coupled to the second input 124 of the phase detector 120, and therefore receives the feedback signal. In FIG. 9, the feedback signal is referred to internally in the phase detector 120 as "fb1".

The delay circuit 910 is coupled between the second input 124 of the phase detector 120 and the second input 954-1 to 954-M of each of the multiplexers 950-1 to 950-M. The delay circuit 910 is configured to delay the feedback signal (e.g., by a delay equal to approximately one cycle (i.e., period) of the VCO 140), and output the resulting delayed feedback signal (labeled "fb2") to the second input 954-1 to 954-M of each of the multiplexers 950-1 to 950-M. In one example, the delay circuit 910 may be implemented with a delay flip-flop that is clocked by the output signal of the VCO 140.

The select input 958-1 to 958-M of each of the multiplexers 950-1 to 950-M is configured to receive a respective bit of the digital code d<M−1:0>. As discussed above, the digital code d<M−1:0> controls the phase interpolation. Each of the multiplexers 950-1 to 950-M is configured to select the respective first input 952-1 to 952-M or the respective second input 954-1 to 954-M based on the bit value of the respective bit, and couple the selected input to the respective output 956-1 to 956-M. Thus, each of the multiplexers 950-1 to 950-M is configured to select feedback signal fb1 or feedback signal fb2 based on the respective bit, and output the selected feedback signal at the respective output 956-1 to 956-M.

Each of the flip-flops 960-1 to 960-M has a respective signal input 962-1 to 962-M, a respective clock input 966-1 to 966-M, a respective reset input 968-1 to 968-M, and a respective output 964-1 to 964-M. The signal input 962-1 to 962-M of each of the flip-flops 960-1 to 960-M is coupled to the output 956-1 to 956-M of a respective one of the multiplexers 950-1 to 950-M. Thus, each of the multiplexers 950-1 to 950-M controls whether feedback signal fb1 or feedback signal fb2 is input to the signal input 962-1 to 962-M of the respective flip-flop 960-1 to 960-M based on the respective bit of the digital code d<M−1:0>.

The clock input 966-1 to 966-M of each of the flip-flops 960-1 to 960-M receives a clock signal (labeled "clk"). In certain aspects, the clock signal may be the output signal of the VCO 140. The reset input 968-1 to 968-M of each of the flip-flops 960-1 to 960-M is coupled to the first input 122 of the phase detector 120, and therefore receives the reference signal. In certain aspects, each flip-flop 960-1 to 960-M is configured to reset the respective output 964-1 to 964-M to zero on a rising edge of the reference signal. The output 964-1 to 964-M of each of the flip-flops 960-1 to 960-M is coupled to a respective one of the outputs 126-1 to 126-M of the phase detector 120, which is coupled to the gate of the transistor 310-1 to 310-M of a respective one of the discharge circuits 308-1 to 308-M.

In operation, each of the multiplexers 950-1 to 950-M selects feedback signal fb1 or feedback signal fb2 based on the respective bit of the digital code d<M−1:0>, and outputs the selected feedback signal to the signal input 962-1 to 962-M of the respective flip-flop 960-1 to 960-M.

Each of the flip-flops 960-1 to 960-M retimes the selected feedback signal from the respective multiplexer 950-1 to 950-M with the clock signal, and outputs a rising edge of a respective pulse on an edge of the retimed feedback signal. The edge of the retimed feedback signal may be a rising edge or a falling edge. Each of the flip-flops 960-1 to 960-M then outputs a falling edge of the respective pulse on a rising edge of the reference signal, which is received at the respective reset input 968-1 to 968-M. This is because each of the flip-flops 960-1 to 960-M is configured to reset the respective output 964-1 to 964-M to zero on the rising edge of the reference signal.

The pulse from each of the flip-flops 960-1 to 960-M drives the gate of the transistor 310-1 to 310-M of the respective one of the discharge circuits 308-1 to 308-M. In this example, the digital code d<M−1:0> controls the number of the transistors 310-1 to 310-M that are driven by a pulse generated from feedback signal fb1 and the number of the transistors 310-1 to 310-M that are driven by a pulse generated from feedback signal fb2. This is because the digital code d<M−1:0> controls the number of the flip-flops 960-1 to 960-M that receive feedback signal fb1 and the number of the flip-flops 960-1 to 960-M that receive feedback signal fb2. This provides phase interpolation between the feedback signals fb1 and fb2 that is controlled by the digital code d<M−1:0>.

The digital code d<M−1:0> may be generated by the PI control circuit 470, which is discussed above according to certain aspects with reference to FIG. 4. As discussed above, the PI control circuit 470 may generate the digital code d<M−1:0> to cancel the effect of quantization error due to modulation of the divider by the DSM 160.

In the above example, the delay circuit 910 may have a delay of approximately one cycle of the VCO 140, and may be implemented with a delay flip-flop that is clocked by the output of the VCO 140. However, it is to be appreciated that the delay circuit 910 is not limited to this example. In other implementations, the delay circuit 910 may have a delay approximately equal to two cycles of the VCO 140 or another multiple of the cycle of the VCO 140.

Figure 10:
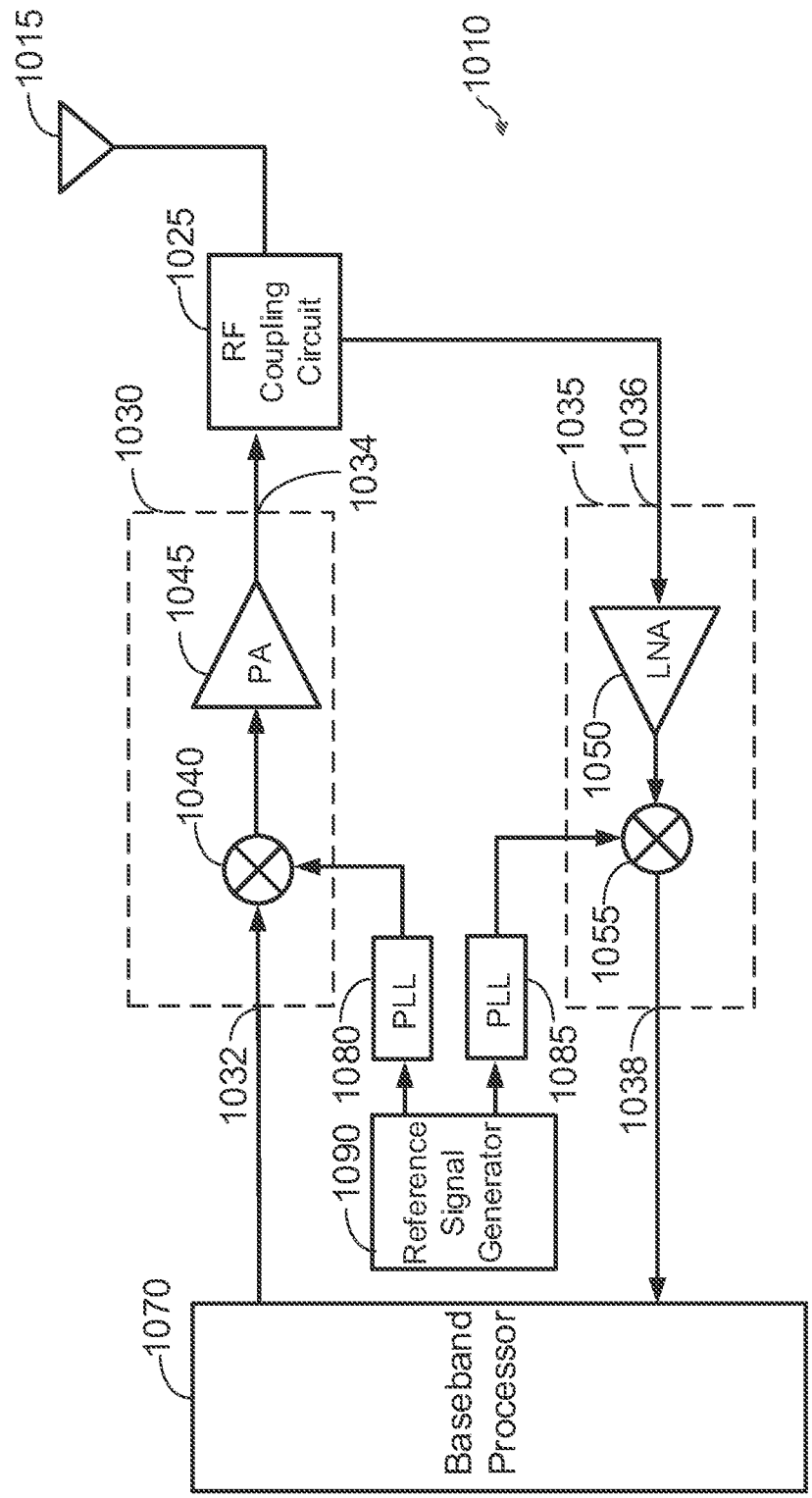
FIG. 10 shows an exemplary wireless device according to certain aspects of the present disclosure.

FIG. 10 illustrates a wireless device 1010 in which the exemplary PLL 110 may be used according to certain aspects. The wireless device 1010 may include a transmitter 1030 and a receiver 1035 for wireless communications (e.g., with a base station). The wireless device 1010 may also include a baseband processor 1070, a radio frequency (RF) coupling circuit 1025, an antenna 1015, a reference signal generator 1090, a first PLL 1080, and a second PLL 1085. Although one transmitter 1030, one receiver 1035, and one antenna 1015 are shown in FIG. 10, it is to be appreciated that the wireless device 1010 may include any number of transmitters, receivers, and antennas.

In the example in FIG. 10, the transmitter 1030 has an input 1032 coupled to the baseband processor 1070, and an output 1034 coupled to the antenna 1015 via the RF coupling circuit 1025. The transmitter 1030 may include a mixer 1040, and a power amplifier 1045. The mixer 1040 is coupled between the input 1032 and the power amplifier 1045, and the power amplifier 1045 is coupled between the mixer 1040 and the output 1034. In one example, the mixer 1040 is configured to receive a baseband signal from the baseband processor 1070 via the input 1032 and mix the baseband signal with a local oscillator signal to frequency upconvert the baseband signal into an RF transmit signal. The power amplifier 1045 is configured to amplify the RF transmit signal and output the amplified RF transmit signal at the output 1034 for transmission via the antenna 1015. It is to be appreciated that the transmitter 1030 may include one or more additional components not shown in FIG. 10. For example, in some implementations, the transmitter 1030 may include one or more filters, a phase shifter, and/or one or more additional amplifiers in the signal path between the input 1032 and the output 1034 of the transmitter 1030.

In the example in FIG. 10, the receiver 1035 has an input 1036 coupled to the antenna 1015 via the RF coupling circuit 1025, and an output 1038 coupled to the baseband processor 1070. The receiver 1035 may include a low noise amplifier 1050, and a mixer 1055. The low noise amplifier 1050 is coupled between the input 1036 and the mixer 1055, and the mixer 1055 is coupled between the low noise amplifier 1050 and the output 1038. In one example, the low noise amplifier 1050 is configured to receive an RF signal from the antenna 1015 via the RF coupling circuit 1025, amplify the RF signal, and output the amplified RF signal to the mixer 1055. The mixer 1055 is configured to mix the RF signal with a local oscillator signal to frequency downconvert the RF signal into a baseband signal. It is to be appreciated that the receiver 1035 may include one or more additional components not shown in FIG. 10. For example, in some implementations, the receiver 1035 may include one or more filters, a phase shifter, and/or one or more additional amplifiers in the signal path between the input 1036 and the output 1038 of the receiver 1035.

The RF coupling circuit 1025 is coupled between the output 1034 of the transmitter 1030 and the antenna 1015. The RF coupling circuit 1025 is also coupled between the antenna 1015 and the input 1036 of the receiver 1035. In one example, the RF coupling circuit 1025 may be implemented with a duplexer configured to couple RF signals from the output 1034 of the transmitter 1030 to the antenna 1015, and couple RF signals received from the antenna 1015 to the input 1036 of the receiver 1035. In other implementations, the RF coupling circuit 1025 may include one or more switches configured to couple the transmitter 1030 and the receiver 1035 to the antenna 1015 one at a time.

The reference signal generator 1090 is configured to generate and output a reference signal for the first PLL 1080 and the second PLL 1085. The reference signal generator 1090 may include a crystal oscillator, or another type of circuit configured to generate the reference signal.

The first PLL 1080 is coupled between the reference signal generator 1090 and the mixer 1040 of the transmitter 1030. The first PLL 1080 is configured to receive the reference signal from the reference signal generator 1090 and multiply the frequency of the reference signal to generate the local oscillator signal for the mixer 1040. The first PLL 1080 may be implemented with the exemplary PLL 110 according to any one or more of the aspects shown in FIGS. 1 to 9, in which the first input 122 is coupled to the reference signal generator 1090 to receive the reference signal, and the output 112 is coupled to the mixer 1040.

The second PLL 1085 is coupled between the reference signal generator 1090 and the mixer 1055 of the receiver 1035. The second PLL 1085 is configured to receive the reference signal from the reference signal generator 1090 and multiply the frequency of the reference signal to generate the local oscillator signal for the mixer 1055. The second PLL 1085 may be implemented with the exemplary PLL 110 according to any one or more of the aspects shown in FIGS. 1 to 9, in which the first input 122 is coupled to the reference signal generator 1090 to receive the reference signal, and the output 112 is coupled to the mixer 1055.

Figure 11:
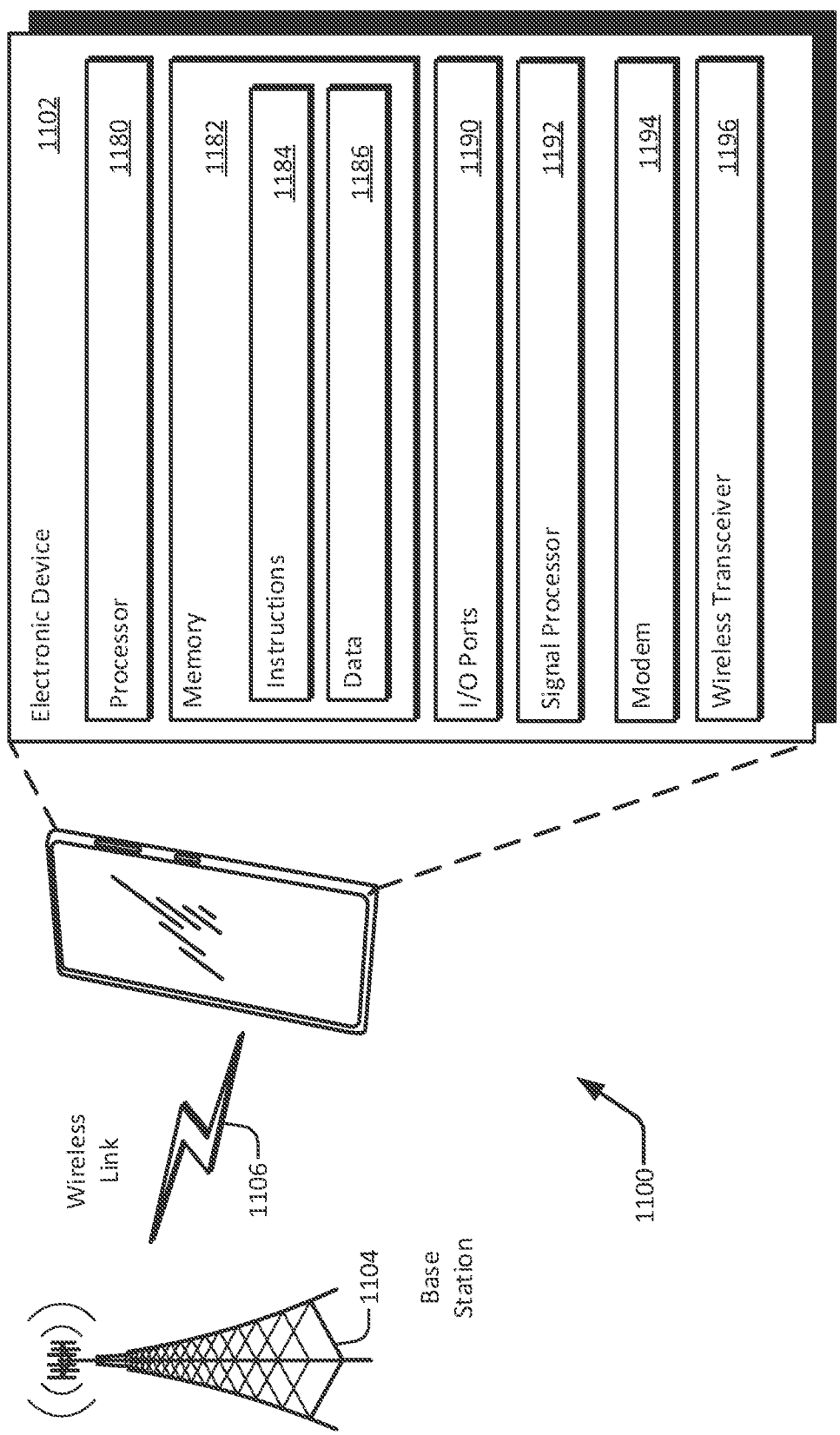
FIG. 11 is a diagram of an environment including an electronic device that includes a transceiver according to certain aspects of the present disclosure.

FIG. 11 is a diagram of an environment 1100 that includes an electronic device 1102 and a base station 1104. The electronic device 1102 includes a wireless transceiver 1196, which may include the exemplary transmitter 1030, receiver 1035, and the PLLs 1080 and 1085 shown in FIG. 10. In certain aspects, the electronic device 1102 may correspond to the wireless device 1010 shown in FIG. 10.

In the environment 1100, the electronic device 1102 communicates with the base station 1104 through a wireless link 1106. As shown, the electronic device 1102 is depicted as a smart phone. However, the electronic device 1102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1104 communicates with the electronic device 1102 via the wireless link 1106, which may be implemented as any suitable type of wireless link. Although depicted as a base station tower of a cellular radio network, the base station 1104 may represent or be implemented as another device, such as a satellite, terrestrial broadcast tower, access point, peer to peer device, mesh network node, fiber optic line, another electronic device generally as described above, and so forth. Hence, the electronic device 1102 may communicate with the base station 1104 or another device via a wired connection, a wireless connection, or a combination thereof. The wireless link 1106 can include a downlink of data or control information communicated from the base station 1104 to the electronic device 1102 and an uplink of other data or control information communicated from the electronic device 1102 to the base station 1104. The wireless link 1106 may be implemented using any suitable communication protocol or standard, such as 3rd Generation Partnership Project Long-Term Evolution (3GPP LTE, 3GPP NR 5G), IEEE 802.11, IEEE 802.11, Bluetooth™, and so forth.

The electronic device 1102 includes a processor 1180 and a memory 1182. The memory 1182 may be or form a portion of a computer readable storage medium. The processor 1180 may include any type of processor, such as an application processor or a multi-core processor, that is configured to execute processor-executable instructions (e.g., code) stored by the memory 1182. The memory 1182 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1182 is implemented to store instructions 1184, data 1186, and other information of the electronic device 1102.

The electronic device 1102 may also include input/output (I/O) ports 1190. The I/O ports 1190 enable data exchanges or interaction with other devices, networks, or users or between components of the device.

The electronic device 1102 may further include a signal processor (SP) 1192 (e.g., such as a digital signal processor (DSP)). The signal processor 1192 may function similar to the processor 1180 and may be capable of executing instructions and/or processing information in conjunction with the memory 1182.

For communication purposes, the electronic device 1102 also includes a modem 1194, the wireless transceiver 1196, and one or more antennas (e.g., the antenna 1015). The wireless transceiver 1196 provides connectivity to respective networks and other electronic devices connected therewith using RF wireless signals. The wireless transceiver 1196 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Figure 12:
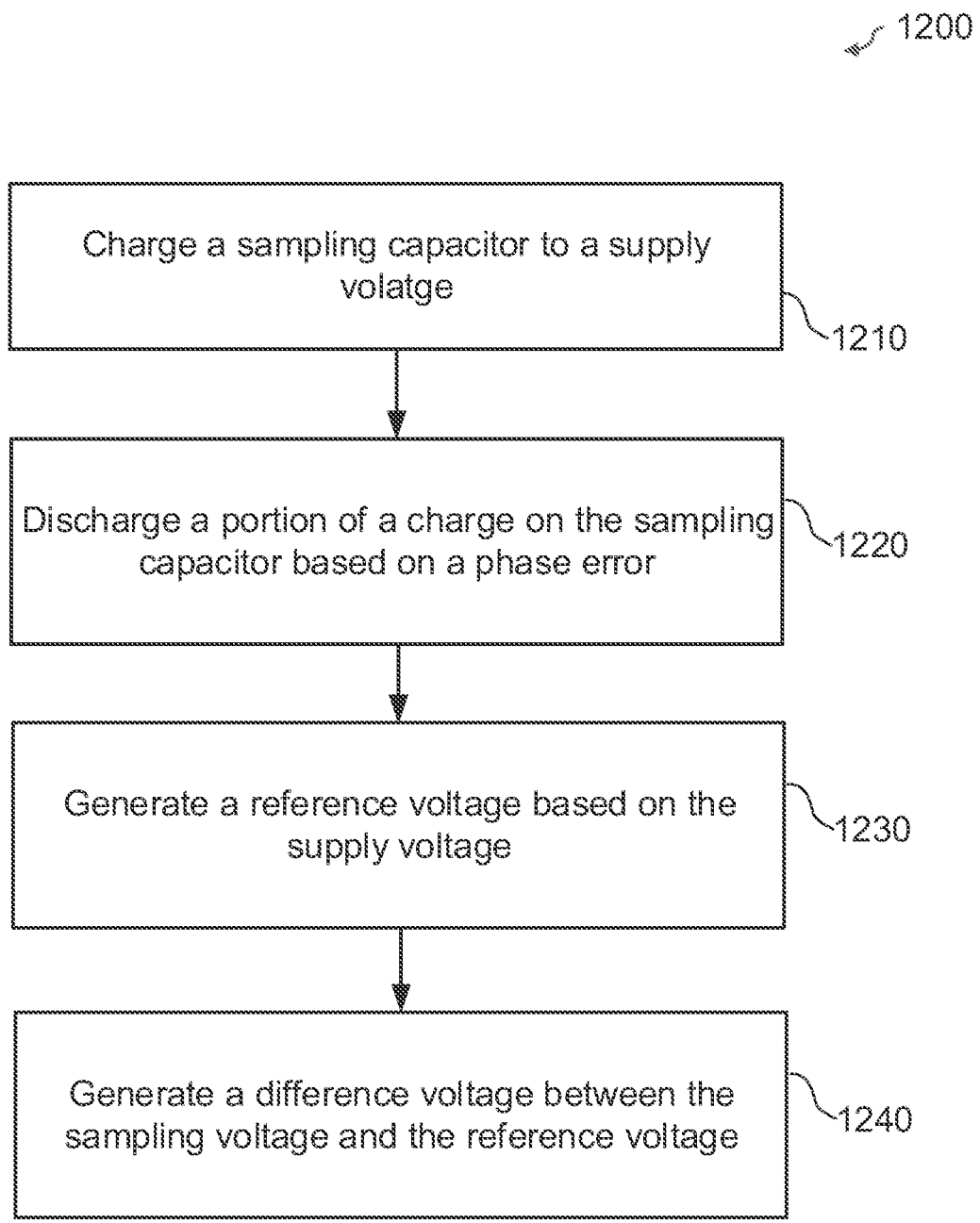
FIG. 12 is a flowchart illustrating a method of sampling according to certain aspects of the present disclosure.

FIG. 12 illustrates a method 1200 of sampling according to certain aspects. The method 1200 may be performed by the sampler 130.

At block 1210, a sampling capacitor is charged to a supply voltage. For example, the sampling capacitor (e.g., sampling capacitor 320) may be charged to the supply voltage (e.g., Vdd) by turning on a precharge switch (e.g., precharge switch 325) coupled between the supply voltage and the sampling capacitor. The precharge switch may be turned on by the controller 360. The supply voltage may be provided by the voltage regulator 340.

At block 1220, a portion of a charge on the sampling capacitor is discharged based on a phase error to generate a sampling voltage. For example, the sampling capacitor may be discharged by one or more discharge circuits (e.g., discharge circuits 308-1 to 308-M) based on the phase error. The phase error may be a phase error between a reference signal and a feedback signal of a phase-locked loop (PLL). The feedback signal may be generated by frequency dividing the output signal of a VCO (e.g., VCO 140) of the PLL.

At block 1230, a reference voltage is generated based on the supply voltage. For example, the reference voltage may be generated by the reference-voltage circuit 515.

At block 1240, a difference voltage between the sampling voltage and the reference voltage is generated. For example, the difference voltage may be generated by the difference circuit 520.

In certain aspects, discharging the portion of the charge on the sampling capacitor based on the phase error may include receiving a phase-error signal indicative of the phase error, and driving one or more discharge circuits with the phase-error signal, wherein the one or more discharge circuits are coupled to the sampling capacitor. In one example, each one of the one or more discharge circuits includes a respective transistor (e.g., respective one of transistors 310-1 to 310-M), and a respective resistor (e.g., respective one of resistors 315-1 to 315-M) coupled between the sampling capacitor and the respective transistor. In this example, the phase-error signal may include one or more pulses (e.g., pulse1 and/or pulse2 in FIG. 8), wherein a gate of the transistor of each one of the one or more discharge circuits is driven by one of the one or more pulses. In one example, the phase error signal may include a first pulse and a second pulse (e.g., pulse1 and pulse 2, respectively, in FIG. 8), in which the rising edge of the first pulse and the rising edge of the second pulse are spaced apart by one or more cycles of the VCO 140. In this example, the gates of k of the transistors 310-1 to 310-M are driven by the first pulse and the gates of M-k of the transistors 310-1 to 310-M are driven by the second pulse based on the DSM error signal to cancel quantization error, as discussed above.

In certain aspects, generating the reference voltage may include charging a first capacitor (e.g., first capacitor 530) to the supply voltage, discharging a second capacitor (e.g., second capacitor 540), and sharing charge between the first capacitor and the second capacitor to generate the reference voltage. For example, the charge sharing may include turning on a switch (e.g., first switch 560) coupled between the first capacitor 530 and the second capacitor 540. In one example, the charging of the first capacitor overlaps with the charging of the sampling capacitor in time so that variations in the supply voltage with time are at least partially tracked in the reference voltage.

In certain aspects, generating the difference voltage between the sampling voltage and the reference voltage may include turning on a first switch (e.g., third switch 610) coupled between the sampling capacitor (e.g., sampling capacitor 320) and a first terminal (e.g., first terminal 532) of the first capacitor (e.g., first capacitor 530), and turning on a second switch (e.g., fourth switch 620) coupled between an output (e.g., output 134) of a sampler (e.g., sampler 130) and a second terminal (e.g., second terminal 534) of the first capacitor.

In these aspects, charging the first capacitor to the supply voltage may include turning on a precharge switch (e.g., precharge switch 325) coupled between the supply voltage and the sampling capacitor, and turning on the first switch (e.g., third switch 610).

In certain aspects, generating the difference voltage between the sampling voltage and the reference voltage may include subtracting the reference voltage from the sampling voltage.

It is to be appreciated that the present disclosure is not limited to the exemplary terminology used above to describe aspects of the present disclosure. For example, a phase detector may also be referred to as a phase comparator, a phase frequency detector (PFD), or another term. A frequency divider may also be referred to as a divide-by-N circuit, or another term. A divider of a frequency divider may also be referred to as a divisor, or another term.

The controller 360 and PI control circuit 470 may each be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Implementation examples are described in the following numbered clauses:

1. A sampler, comprising:
   a sampling capacitor;
   a precharge switch coupled to the sampling capacitor;
   one or more discharge circuits coupled to the sampling capacitor; and
   a reference-voltage circuit coupled to the sampling capacitor, wherein the reference-voltage circuit is configured to:
   generate a reference voltage based on a supply voltage; and
   generate a voltage difference between a voltage on the sampling capacitor and the reference voltage.

2. The sampler of clause 1, wherein the precharge switch is coupled between a voltage regulator and the sampling capacitor, and the voltage regulator is configured to provide the supply voltage.

3. The sampler of clause 1 or 2, wherein each one of the one or more discharge circuits comprises:
   a respective transistor; and
   a respective resistor coupled between the sampling capacitor and the respective transistor.

4. The sampler of clause 3, wherein, for each one of the one or more discharge circuits, a gate of the respective transistor is coupled to a phase detector.

5. The sampler of any one of clauses 1 to 4, wherein the reference-voltage circuit comprises:
   at least one capacitor; and
   a difference circuit coupled to the sampling capacitor and the at least one capacitor, wherein the difference circuit is configured to generate the voltage difference.

6. The sampler of clause 5, further comprising a first switch and a second switch, wherein the at least one capacitor comprises:
   a first capacitor coupled to the difference circuit; and
   a second capacitor, wherein the first switch is coupled between the first capacitor and the second capacitor, and the second switch is coupled in parallel with the second capacitor.

7. The sampler of claim 5 or 6, wherein:
   the one or more discharge circuits are coupled to a phase detector; and
   the difference circuit is coupled to a filter.

8. An apparatus, comprising:
   a sampling capacitor;
   a precharge switch coupled to the sampling capacitor;
   one or more discharge circuits coupled to the sampling capacitor; and
   a reference-voltage circuit coupled to the sampling capacitor, wherein the reference-voltage circuit comprises:
   a first capacitor;
   a second capacitor;
   a first switch coupled between the first capacitor and the second capacitor;
   a second switch coupled in parallel with the second capacitor; and
   a difference circuit coupled to the sampling capacitor and the first capacitor.

9. The apparatus of clause 8, further comprising a voltage regulator, wherein the precharge switch is coupled between the voltage regulator and the sampling capacitor.

10. The apparatus of clause 8 or 9, further comprising a controller, wherein, in a precharge phase, the controller is configured to turn on the precharge switch, turn off the first switch, and turn on the second switch.

11. The apparatus of clause 10, wherein, in a charge-sharing phase, the controller is configured to turn off the precharge switch, turn on the first switch, and turn off the second switch.

12. The apparatus of clause 8 or 9, wherein the difference circuit comprises:
   a third switch coupled between the sampling capacitor and a first terminal of the first capacitor; and
   a fourth switch coupled between a second terminal of the first capacitor and an output of the sampler.

13. The apparatus of clause 12, further comprising a controller, wherein, in a precharge phase, the controller is configured to turn on the precharge switch, turn off the first switch, turn on the second switch, turn on the third switch, and turn off the fourth switch.

14. The apparatus of clause 13, wherein, in a charge-sharing phase, the controller is configured to turn off the precharge switch, turn on the first switch, turn off the second switch, turn off the third switch, and turn off the fourth switch.

15. The apparatus of clause 13 or 14, wherein, in a sampling phase, the controller is configured to turn off the precharge switch, turn off the third switch, and turn off the fourth switch.

16. The apparatus of any one of clauses 13 to 15, wherein, in a difference phase, the controller is configured to turn off the precharge switch, turn off the second switch, turn on the third switch, and turn on the fourth switch.

17. The apparatus of any one of clauses 12 to 16, wherein the reference-voltage circuit further comprises a fifth switch coupled between the second terminal of the first capacitor and a ground.

18. The apparatus of clause 8, further comprising a second precharge switch coupled to the first capacitor.

19. The apparatus of clause 18, further comprising a voltage regulator, wherein the first precharge switch is coupled between the voltage regulator and the sampling capacitor, and the second precharge switch is coupled between the voltage regulator and the first capacitor.

20. The apparatus of clause 18 or 19, further comprising a controller, wherein, in a precharge phase, the controller is configured to turn on the first precharge switch, turn on the second precharge switch, turn off the first switch, and turn on the second switch.

21. The apparatus of clause 20, wherein, in a charge-sharing phase, the controller is configured to turn off the first precharge switch, turn off the second precharge switch, turn on the first switch, and turn off the second switch.

22. The apparatus of any one of clauses 8 to 21, further comprising a phase detector having an output coupled to the one or more discharge circuits.

23. The apparatus of clause 22, further comprising:
   a voltage controlled oscillator (VCO);
   a loop filter coupled between the difference circuit and an input of the VCO; and
   a frequency divider coupled between an output of the VCO and an input of the phase detector.

24. The apparatus of clause 23, wherein the loop filter comprises an integration path coupled between the difference circuit and the input of the VCO.

25. The apparatus of any one of clauses 22 to 24, wherein the phase detector has a first input configured to receive a reference signal and a second input configured to receive a feedback signal, and the phase detector comprises:
   a delay circuit having an input coupled to the second input of the phase detector and an output;
   a first pulse circuit having a first input coupled to the first input of the phase detector, a second input coupled to the second input of the phase detector, and an output;
   a second pulse circuit having a first input coupled to the first input of the phase detector, a second input coupled to the output of the delay circuit, and an output; and
   a plurality of multiplexers, each multiplexer having a first input coupled to the output of the first pulse circuit, a second input coupled to the output of the second pulse circuit, and an output coupled to a respective one of the one or more discharge circuits.

26. The apparatus of clause 25, wherein each multiplexer comprises a select input configured to receive a respective bit of a digital code, and wherein each multiplexer is configured to select the respective first input or the respective second input of the multiplexer based on the bit value of the respective bit, and couple the selected input to the respective output.

27. The apparatus of clause 25 or 26, further comprising:
a voltage controlled oscillator (VCO);
a loop filter coupled between the difference circuit and an input of the VCO; and
a frequency divider coupled between an output of the VCO and the second input of the phase detector.

28. The apparatus of any one of clauses 22 to 24, wherein the phase detector has a first input configured to receive a reference signal and a second input configured to receive a feedback signal, and wherein the phase detector comprises:
a delay circuit having an input coupled to the second input of the phase detector and an output;
a plurality of multiplexers, each multiplexer having a first input coupled to the second input of the phase detector, a second input coupled to the output of the delay circuit, and an output; and
a plurality of flip-flops, each flip-flop having a signal input coupled to the output of a respective one of the plurality of multiplexers, a reset input coupled to the first input of the phase detector, a clock input configured to receive a clock signal, and an output coupled to a respective one of the one or more discharge circuits.

29. The apparatus of clause 28, wherein the clock signal comprises an output signal of a voltage controlled oscillator (VCO).

30. The apparatus of clause 28 or 29, wherein each multiplexer comprises a select input configured to receive a respective bit of a digital code, and wherein each multiplexer is configured to select the respective first input or the respective second input of the multiplexer based on the bit value of the respective bit, and couple the selected input to the respective output.

31. The apparatus of any one of clauses 28 to 30, further comprising:
a voltage controlled oscillator (VCO);
a loop filter coupled between the difference circuit and an input of the VCO; and
a frequency divider coupled between an output of the VCO and the second input of the phase detector.

32. The apparatus of any one of clauses 8 to 31, wherein each one of the one or more discharge circuits comprises:
a respective transistor; and
a respective resistor coupled between the sampling capacitor and the respective transistor.

33. The apparatus of clause 32, further comprising a phase detector, wherein, for each one of the one or more discharge circuits, a gate of the respective transistor is coupled to an output of the phase detector.

34. The apparatus of any one of clauses 8 to 21, 32 and 33, further comprising:
a phase detector having a first input, a second input, and an output, wherein the first input is configured to receive a reference signal, and the output is coupled to the one or more discharge circuits;
a voltage controlled oscillator (VCO);
a loop filter coupled between the difference circuit and an input of the VCO; and
a frequency divider coupled between an output of the VCO and the second input of the phase detector, wherein the frequency divider is configured to frequency divide an output signal of the VCO to generate a feedback signal.

35. The apparatus of clause 34, wherein the phase detector is configured to generate a phase-error signal indicative of a phase error between the reference signal and the feedback signal.

36. The apparatus of clause 35, wherein the phase-error signal comprises one or more pulses, and each one of the one or more discharge circuits is driven by one of the one or more pulses.

37. The apparatus of clause 36, wherein the one or more pulses comprises a first pulse and a second pulse, and the phase detector is configured to selectively output the first pulse or the second pulse to each one of the one or more discharge circuits.

38. The apparatus of clause 37, wherein:
the phase detector comprises a delay circuit configured to generate a delayed feedback signal based on the feedback signal; and
the phase detector is further configured to generate the first pulse based on a phase error between the reference signal and the feedback signal and generate the second pulse based on a phase error between the reference signal and the delayed feedback signal.

39. A method of sampling, comprising:
charging a sampling capacitor to a supply voltage;
discharging a portion of a charge on the sampling capacitor based on a phase error to generate a sampling voltage;
generating a reference voltage based on the supply voltage; and
generating a difference voltage between the sampling voltage and the reference voltage.

40. The method of clause 39, wherein generating the reference voltage comprises charging at least one capacitor to the supply voltage.

41. The method of clause 39 or 40, wherein discharging the portion of the charge on the sampling capacitor based on the phase error comprises:
receiving a phase-error signal indicative of the phase error; and
driving one or more discharge circuits with the phase-error signal, wherein the one or more discharge circuits are coupled to the sampling capacitor.

42. The method of clause 41, wherein each one of the one or more discharge circuits comprises:
a respective transistor; and
a respective resistor coupled between the sampling capacitor and the respective transistor.

43. The method of clause 42, wherein the phase-error signal comprises one or more pulses, and the transistor of each one of the one or more discharge circuits is driven by one of the one or more pulses.

44. The method of any one of clauses 39 to 43, wherein generating the reference voltage comprises:
charging a first capacitor to the supply voltage;
discharging a second capacitor; and
sharing charge between the first capacitor and the second capacitor to generate the reference voltage.

45. The method of clause 44, wherein generating the difference voltage between the sampling voltage and the reference voltage comprises:
turning on a first switch coupled between the sampling capacitor and a first terminal of the first capacitor; and
turning on a second switch coupled between an output of a sampler and a second terminal of the first capacitor.

46. The method of clause 45, wherein charging the first capacitor to the supply voltage comprises:
turning on a precharge switch coupled between the supply voltage and the sampling capacitor; and
turning on the first switch.

47. The method of any one of clauses 39 to 46, wherein generating the difference voltage between the sampling voltage and the reference voltage comprises subtracting the reference voltage from the sampling voltage.

48. An apparatus for sampling, comprising:
means for charging a sampling capacitor to a supply voltage;
means for discharging a portion of a charge on the sampling capacitor based on a phase error to generate a sampling voltage;
means for generating a reference voltage based on the supply voltage; and
means for generating a difference voltage between the sampling voltage and the reference voltage.

49. The apparatus of clause 48, wherein the means for generating the reference voltage comprises means for charging at least one capacitor to the supply voltage.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect electrical coupling between two structures. It is also to be appreciated that the term "ground" may refer to a DC ground or an alternating current (AC) ground, and thus the term "ground" covers both possibilities.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A sampler, comprising:
a sampling capacitor;
a precharge switch coupled to the sampling capacitor;
one or more discharge circuits coupled to the sampling capacitor; and
a reference-voltage circuit coupled to the sampling capacitor, wherein the reference-voltage circuit is configured to:
generate a reference voltage based on a supply voltage; and
generate a voltage difference between a voltage on the sampling capacitor and the reference voltage.

2. The sampler of claim 1, wherein the precharge switch is coupled between a voltage regulator and the sampling capacitor, and the voltage regulator is configured to provide the supply voltage.

3. The sampler of claim 1, wherein each one of the one or more discharge circuits comprises:
a respective transistor; and
a respective resistor coupled between the sampling capacitor and the respective transistor.

4. The sampler of claim 3, wherein, for each one of the one or more discharge circuits, a gate of the respective transistor is coupled to a phase detector.

5. The sampler of claim 1, wherein the reference-voltage circuit comprises:
at least one capacitor; and
a difference circuit coupled to the sampling capacitor and the at least one capacitor, wherein the difference circuit is configured to generate the voltage difference.

6. The sampler of claim 5, further comprising a first switch and a second switch, wherein the at least one capacitor comprises:
a first capacitor coupled to the difference circuit; and
a second capacitor, wherein the first switch is coupled between the first capacitor and the second capacitor, and the second switch is coupled in parallel with the second capacitor.

7. The sampler of claim 5, wherein:
the one or more discharge circuits are coupled to a phase detector; and
the difference circuit is coupled to a filter.

8. An apparatus, comprising:
a sampling capacitor;
a precharge switch coupled to the sampling capacitor;
one or more discharge circuits coupled to the sampling capacitor; and
a reference-voltage circuit coupled to the sampling capacitor, wherein the reference-voltage circuit comprises:
a first capacitor;
a second capacitor;
a first switch coupled between the first capacitor and the second capacitor;
a second switch coupled in parallel with the second capacitor; and
a difference circuit coupled to the sampling capacitor and the first capacitor.

9. The apparatus of claim 8, further comprising a voltage regulator, wherein the precharge switch is coupled between the voltage regulator and the sampling capacitor.

10. The apparatus of claim 8, further comprising a controller, wherein, in a precharge phase, the controller is configured to turn on the precharge switch, turn off the first switch, and turn on the second switch.

11. The apparatus of claim 10, wherein, in a charge-sharing phase, the controller is configured to turn off the precharge switch, turn on the first switch, and turn off the second switch.

12. The apparatus of claim 8, wherein the difference circuit comprises:
a third switch coupled between the sampling capacitor and a first terminal of the first capacitor; and
a fourth switch coupled between a second terminal of the first capacitor and an output of the apparatus.

13. The apparatus of claim 12, further comprising a controller, wherein, in a precharge phase, the controller is configured to turn on the precharge switch, turn off the first switch, turn on the second switch, turn on the third switch, and turn off the fourth switch.

14. The apparatus of claim 13, wherein, in a charge-sharing phase, the controller is configured to turn off the precharge switch, turn on the first switch, turn off the second switch, turn off the third switch, and turn off the fourth switch.

15. The apparatus of claim 13, wherein, in a sampling phase, the controller is configured to turn off the precharge switch, turn off the third switch, and turn off the fourth switch.

16. The apparatus of claim 13, wherein, in a difference phase, the controller is configured to turn off the precharge switch, turn off the second switch, turn on the third switch, and turn on the fourth switch.

17. The apparatus of claim 12, wherein the reference-voltage circuit further comprises a fifth switch coupled between the second terminal of the first capacitor and a ground.

18. The apparatus of claim 8, further comprising a second precharge switch coupled to the first capacitor.

19. The apparatus of claim 18, further comprising a voltage regulator, wherein the first precharge switch is coupled between the voltage regulator and the sampling capacitor, and the second precharge switch is coupled between the voltage regulator and the first capacitor.

20. The apparatus of claim 18, further comprising a controller, wherein, in a precharge phase, the controller is configured to turn on the first precharge switch, turn on the second precharge switch, turn off the first switch, and turn on the second switch.

21. The apparatus of claim 20, wherein, in a charge-sharing phase, the controller is configured to turn off the first precharge switch, turn off the second precharge switch, turn on the first switch, and turn off the second switch.

22. The apparatus of claim 8, further comprising a phase detector having an output coupled to the one or more discharge circuits.

23. The apparatus of claim 22, further comprising:
a voltage controlled oscillator (VCO);
a loop filter coupled between the difference circuit and an input of the VCO; and
a frequency divider coupled between an output of the VCO and an input of the phase detector.

24. The apparatus of claim 22, wherein the phase detector has a first input configured to receive a reference signal and a second input configured to receive a feedback signal, and the phase detector comprises:
a delay circuit having an input coupled to the second input of the phase detector and an output;
a first pulse circuit having a first input coupled to the first input of the phase detector, a second input coupled to the second input of the phase detector, and an output;
a second pulse circuit having a first input coupled to the first input of the phase detector, a second input coupled to the output of the delay circuit, and an output; and
a plurality of multiplexers, each multiplexer having a first input coupled to the output of the first pulse circuit, a second input coupled to the output of the second pulse circuit, and an output coupled to a respective one of the one or more discharge circuits.

25. The apparatus of claim 24, wherein each multiplexer comprises a select input configured to receive a respective bit of a digital code, and wherein each multiplexer is configured to select the respective first input or the respective second input of the multiplexer based on the bit value of the respective bit, and couple the selected input to the respective output.

26. The apparatus of claim 22, wherein the phase detector has a first input configured to receive a reference signal and a second input configured to receive a feedback signal, and wherein the phase detector comprises:
a delay circuit having an input coupled to the second input of the phase detector and an output;
a plurality of multiplexers, each multiplexer having a first input coupled to the second input of the phase detector, a second input coupled to the output of the delay circuit, and an output; and
a plurality of flip-flops, each flip-flop having a signal input coupled to the output of a respective one of the plurality of multiplexers, a reset input coupled to the first input of the phase detector, a clock input configured to receive a clock signal, and an output coupled to a respective one of the one or more discharge circuits.

27. The apparatus of claim 26, wherein each multiplexer comprises a select input configured to receive a respective bit of a digital code, and wherein each multiplexer is configured to select the respective first input or the respective second input of the multiplexer based on the bit value of the respective bit, and couple the selected input to the respective output.

28. The apparatus of claim 8, wherein each one of the one or more discharge circuits comprises:
a respective transistor; and
a respective resistor coupled between the sampling capacitor and the respective transistor.

29. The apparatus of claim 28, further comprising a phase detector, wherein, for each one of the one or more discharge circuits, a gate of the respective transistor is coupled to an output of the phase detector.

30. The apparatus of claim 8, further comprising:
a phase detector having a first input, a second input, and an output, wherein the first input is configured to receive a reference signal, and the output is coupled to the one or more discharge circuits;
a voltage controlled oscillator (VCO);
a loop filter coupled between the difference circuit and an input of the VCO; and
a frequency divider coupled between an output of the VCO and the second input of the phase detector, wherein the frequency divider is configured to frequency divide an output signal of the VCO to generate a feedback signal.

31. A method of sampling, comprising:
charging a sampling capacitor to a supply voltage;
discharging a portion of a charge on the sampling capacitor based on a phase error to generate a sampling voltage;
generating a reference voltage based on the supply voltage; and
generating a difference voltage between the sampling voltage and the reference voltage.

32. The method of claim 31, wherein generating the reference voltage comprises charging at least one capacitor to the supply voltage.

33. The method of claim 31, wherein generating the reference voltage comprises:
charging a first capacitor to the supply voltage;
discharging a second capacitor; and
sharing charge between the first capacitor and the second capacitor to generate the reference voltage.

34. The method of claim 33, wherein generating the difference voltage between the sampling voltage and the reference voltage comprises:
turning on a first switch coupled between the sampling capacitor and a first terminal of the first capacitor; and
turning on a second switch coupled between an output of a sampler and a second terminal of the first capacitor.

35. The method of claim 34, wherein charging the first capacitor to the supply voltage comprises:
turning on a precharge switch coupled between the supply voltage and the sampling capacitor; and
turning on the first switch.

36. The method of claim 31, wherein generating the difference voltage between the sampling voltage and the reference voltage comprises subtracting the reference voltage from the sampling voltage.

37. An apparatus for sampling, comprising:
- means for charging a sampling capacitor to a supply voltage;
- means for discharging a portion of a charge on the sampling capacitor based on a phase error to generate a sampling voltage;
- means for generating a reference voltage based on the supply voltage; and
- means for generating a difference voltage between the sampling voltage and the reference voltage.

38. The apparatus of claim 37, wherein the means for generating the reference voltage comprises means for charging at least one capacitor to the supply voltage.

* * * * *